US012713689B2

(12) United States Patent
Savant et al.

(10) Patent No.: US 12,713,689 B2
(45) **Date of Patent: *Aug. 18, 2026**

(54) TRENCH ISOLATION WITH CONDUCTIVE STRUCTURES

(71) Applicant: Taiwan Semiconductor Manufacturing Co., Ltd., Hsinchu (TW)

(72) Inventors: Chandrashekhar Prakash Savant, Hsinchu (TW); Yuh-Ta Fan, Shin Chu City (TW); Tien-Wei Yu, Kaohsiung (TW); Chia-Ming Tsai, Zhubei City (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/736,998

(22) Filed: Jun. 7, 2024

(65) Prior Publication Data

US 2024/0395629 A1 Nov. 28, 2024

Related U.S. Application Data

(60) Division of application No. 17/815,094, filed on Jul. 26, 2022, now Pat. No. 12,033,900, which is a (Continued)

(51) Int. Cl.

| | |
|---|---|
| ***H10D 84/03*** | (2025.01) |
| ***H10D 64/01*** | (2025.01) |
| ***H10D 64/66*** | (2025.01) |
| ***H10D 84/01*** | (2026.01) |
| ***H10D 84/85*** | (2025.01) |
| ***H10P 50/66*** | (2026.01) |

(52) U.S. Cl.

CPC ..... *H10D 84/038* (2025.01); *H10D 64/01318* (2026.01); *H10D 64/01326* (2026.01);

(Continued)

(58) Field of Classification Search

CPC ............ H10D 84/038; H01L 21/28088; H01L 21/28123; H01L 21/32134

See application file for complete search history.

(56) References Cited

U.S. PATENT DOCUMENTS 9,105,490 B2 8/2015 Wang et al.
9,236,267 B2 1/2016 De et al.

(Continued)

*Primary Examiner* — Christine A Enad

(74) *Attorney, Agent, or Firm* — Sterne, Kessler, Goldstein & Fox P.L.L.C.

(57) ABSTRACT

The present disclosure describes a semiconductor device having metal boundary trench isolation with electrically conductive intermediate structures acting as a metal diffusion barrier. The semiconductor structure includes a first fin structure and a second fin structure on a substrate, an insulating layer between the first and second fin structures, a gate dielectric layer on the insulating layer and the first and second fin structures, and a first work function stack and a second work function stack on the gate dielectric layer. The first work function stack is over the first fin structure and a first portion of the insulating layer, and the second work function stack is over the second fin structure and a second portion of the insulating layer adjacent to the first portion. The semiconductor structure further includes a conductive intermediate structure on the gate dielectric layer and between the first and second work function stacks.

20 Claims, 23 Drawing Sheets

Related U.S. Application Data continuation of application No. 16/913,429, filed on Jun. 26, 2020, now Pat. No. 11,430,700.

(52) U.S. Cl.
CPC ....... *H10D 64/667* (2025.01); *H10D 84/0177* (2025.01); *H10D 84/0193* (2025.01); *H10D 84/853* (2025.01); *H10P 50/667* (2026.01)

(56) References Cited

U.S. PATENT DOCUMENTS

| | | | | |
|---|---|---|---|---|
| 9,236,300 | B2 | 1/2016 | Liaw | |
| 9,406,804 | B2 | 8/2016 | Huang et al. | |
| 9,443,769 | B2 | 9/2016 | Wang et al. | |
| 9,520,482 | B1 | 12/2016 | Chang et al. | |
| 9,548,366 | B1 | 1/2017 | Ho et al. | |
| 9,576,814 | B2 | 2/2017 | Wu et al. | |
| 9,831,183 | B2 | 11/2017 | Lin et al. | |
| 9,859,386 | B2 | 1/2018 | Ho et al. | |
| 9,911,736 | B1 | 3/2018 | Zang et al. | |
| 10,236,219 | B1 * | 3/2019 | Anderson | H10D 84/0193 |
| 10,644,134 | B2 * | 5/2020 | Chen | H10D 64/517 |
| 11,430,700 | B2 * | 8/2022 | Savant | H01L 21/28088 |
| 11,460,700 | B2 | 10/2022 | Yamamoto | |
| 2018/0108745 | A1 * | 4/2018 | Li | H01L 21/02304 |
| 2018/0108770 | A1 | 4/2018 | Cheng et al. | |
| 2018/0350955 | A1 * | 12/2018 | Chen | H10D 84/038 |
| 2020/0135588 | A1 | 4/2020 | Wu et al. | |
| 2023/0005796 | A1 | 1/2023 | Savant et al. | |

* cited by examiner

Form a gate dielectric layer on a first fin structure, a second fin structure, and an insulating layer between the first fin structure and the second fin structure — 210

Form a first work function stack and a second work function stack on the gate dielectric layer and over the first fin structure and the second fin structure respectively — 220

Form a trench between the first work function stack and the second work function stack — 230

Form a conductive intermediate structure in the trench — 240

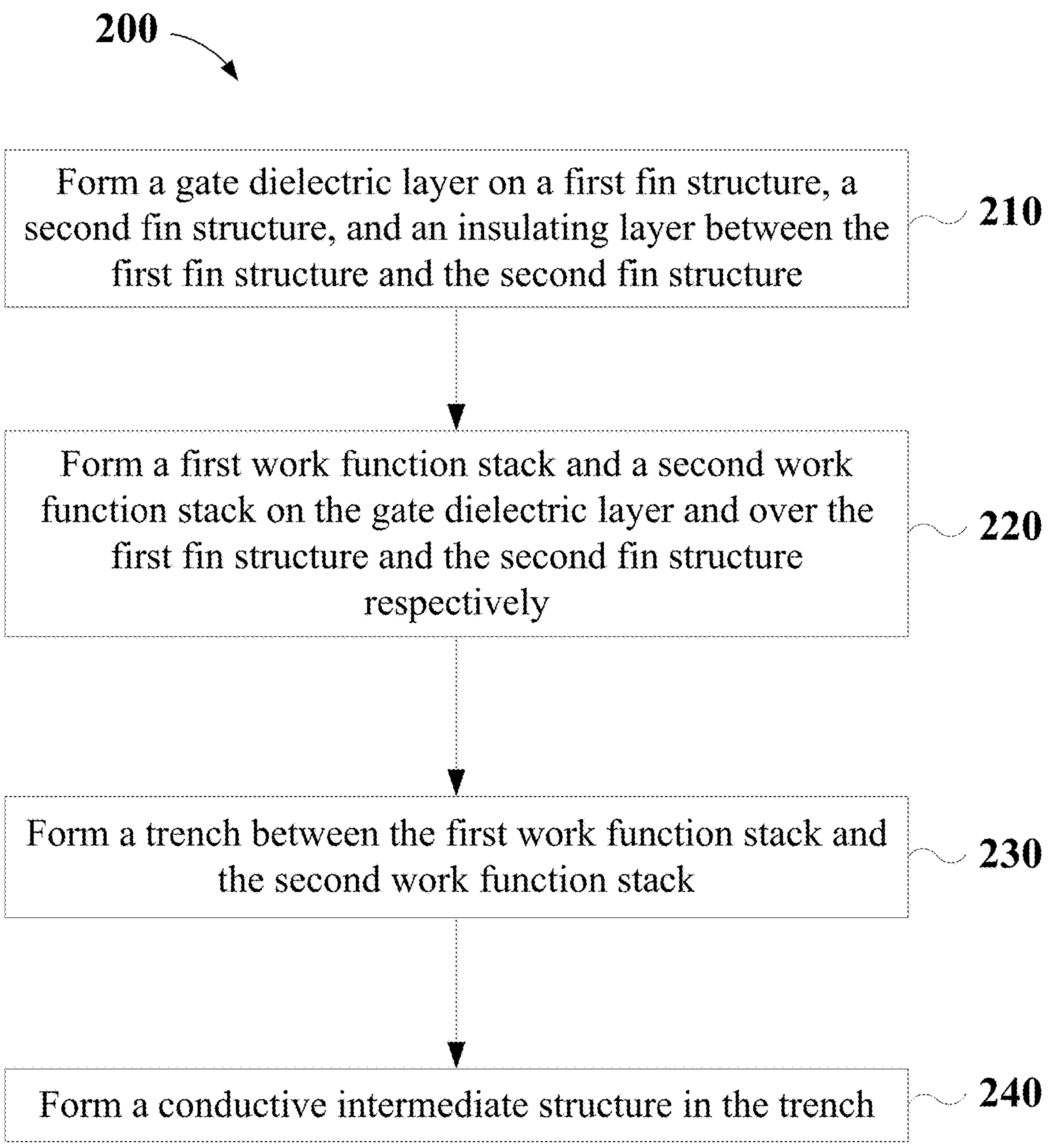

FIG. 2

TRENCH ISOLATION WITH CONDUCTIVE STRUCTURES

CROSS-REFERENCE TO RELATED APPLICATION

This application is a divisional of U.S. Non-Provisional patent application Ser. No. 17/815,094, filed on Jul. 26, 2022, titled "Trench Isolation with Conductive Structures," which is a continuation of U.S. Non-Provisional patent application Ser. No. 16/913,429, filed on Jun. 26, 2020, titled "Trench Isolation with Conductive Structures," now U.S. Pat. No. 11,430,700, which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has introduced challenges to improve performances of the semiconductor devices.

BRIEF DESCRIPTION OF THE DRAWINGS

Aspects of the present disclosure are best understood from the following detailed description when read with the accompanying figures.

FIG. 2 is a flow diagram of a method for fabricating a semiconductor device having metal boundary trench isolation with conductive intermediate structures, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
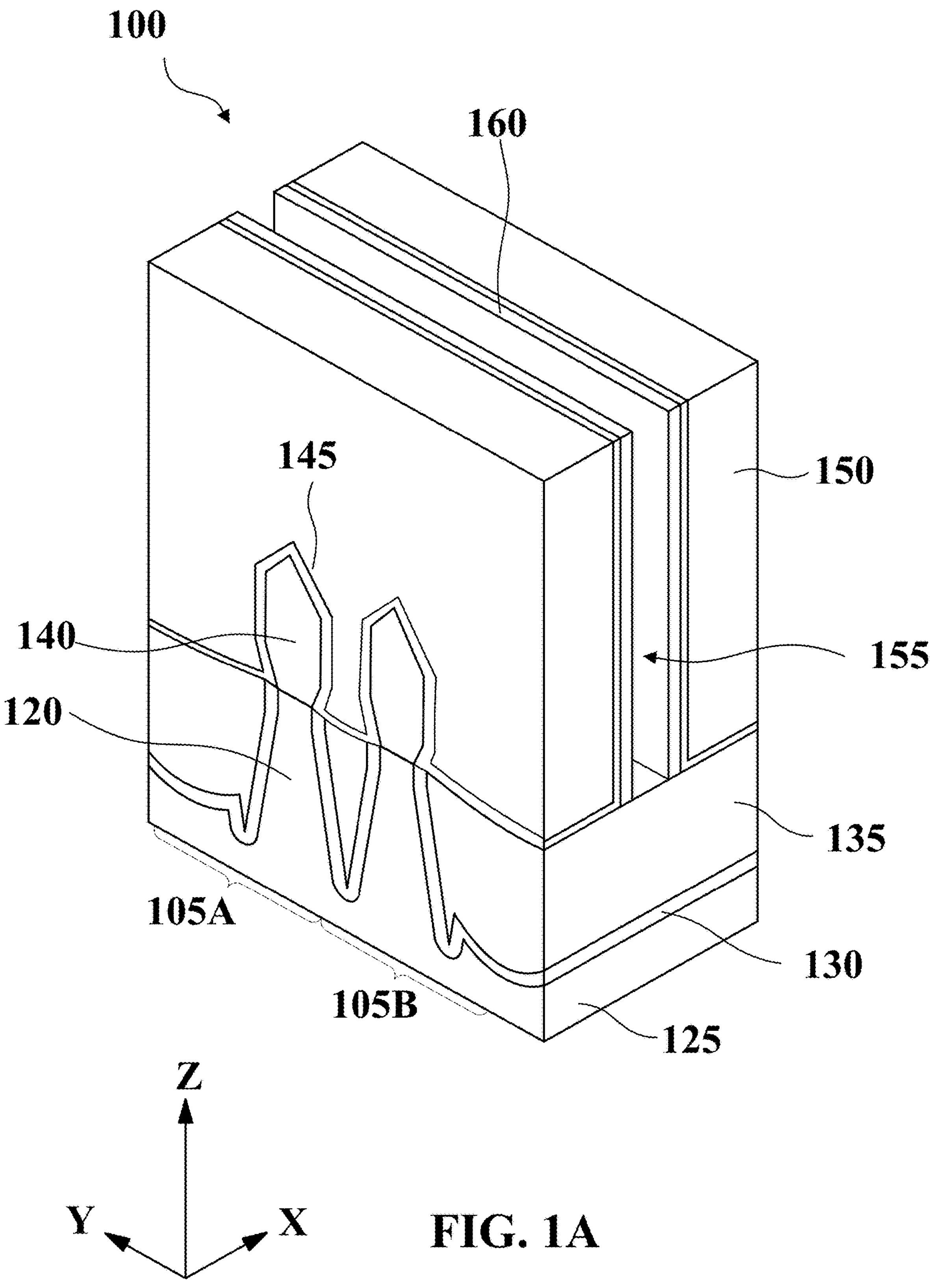
FIGS. 1A, 1B, and 1C illustrate isometric views and a cross-sectional view of a partially fabricated semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "high-k" refers to a high dielectric constant. In the field of semiconductor device structures and manufacturing processes, high-k refers to a dielectric constant that is greater than the dielectric constant of $SiO_2$ (e.g., greater than about 3.9).

As used herein, the term "p-type" defines a structure, layer, and/or region as being doped with p-type dopants, such as boron.

As used herein, the term "n-type" defines a structure, layer, and/or region as being doped with n-type dopants, such as phosphorus.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The layers within a gate structure or gate stack of a field effect transistor (FET) control, in part, the transistor's threshold voltage ($V_t$). More particularly, the $V_t$ value of a transistor depends on the collective thickness and/or material composition of the layers included in its gate stack. Therefore, by controlling the thickness (or the number of layers) and/or material composition of these layers in each FET, FETs can be manufactured with different $V_t$. For example, FETs with a low $V_t$ (e.g., between about 50 mV and about 160 mV) can be used for "low" or "ultra-low" power applications within a chip, and FETs with high $V_t$ (e.g., greater than about 200 mV) can be used for high power applications within the chip. In addition, n-type FET (also referred to as "NFET") and p-type FET (also referred to as "PFET") can be manufactured with different $V_t$ suitable for each type of FET. In FETs, in some embodiments, a way to control (e.g., lower) the $V_t$ is to control the aluminum concentration in the FET's work function stack layers. In some embodiments, a way to control the $V_t$ in FETs is to use different compositions and thicknesses for the FET's work function stack layers of the gate stack. Different complementary MOS (CMOS) devices (e.g., an inverter logic device, a NOR logic device, a NAND logic device, a ring oscillator device, and an SRAM device) can be formed by various adjacent NFETs and PFETs.

With increasing demand of lower power consumption, high performance, and small area for semiconductor devices, FETs with different $V_t$ can have their challenges. For example, distances between FETs with different $V_t$ decreases due to continuous device scaling down. In some semiconductor devices, two or more FETs with different $V_t$ can have connected gates and the gate stacks of these FETs abut each other at a metal boundary. In some embodiments, the metal boundary can be a boundary where one metal stack of one FET device borders another metal stack of an adjacent FET device. For example, the gates of the NFET and PFET in an inverter are connected and the gate stacks of the NFET and PFET abut each other at the N-P metal boundary. The $V_t$ of one FET can shift due to diffusion of metals (e.g., aluminum) from the gate stack layers of the adjacent FET across the metal boundary, which is referred to as "metal boundary effect" (MBE). As a result, the metals (e.g., aluminum) in the gate stack layer of one FET device can decrease with the diffusion of metals, and the metals (e.g., aluminum) in the gate stack layer of the adjacent FET device with a different $V_t$ can increase with the diffusion of metals. The decrease of metals (e.g., aluminum) in the one FET device can increase an effective work function of the one FET device, which can increase the absolute value of a Vt of an NFET and can decrease the absolute value of a Vt of a PFET. Similarly, the increase of metals (e.g., aluminum) in the adjacent FET device can decrease an effective work function of the adjacent FET device, which can decrease the absolute value of a Vt of an NFET and can increase the absolute value of a Vt of a PFET. With decreasing distances between adjacent FETs, $V_t$ shifts due to the MBE effect can exacerbate and further degrade device performance.

Various embodiments in the present disclosure provide methods for forming a semiconductor device having metal boundary trench isolation with an electrically conductive intermediate structure acting as a metal diffusion barrier. In some embodiments, the conductive intermediate structure can be formed in a trench formed at the metal boundary. The conductive intermediate structure can be between work function stacks at each side of the metal boundary. The conductive intermediate structure can electrically connect the work function stacks at each side of the metal boundary. In some embodiments, the conductive intermediate structure can be a conductive barrier structure that blocks metal (e.g., aluminum, titanium, etc.) diffusion across the metal boundary. In some embodiments, the conductive intermediate structure can be a conductive barrier structure that blocks contamination (e.g., carbon, chlorine, fluorine, and nitrogen) diffusion across the metal boundary. The conductive intermediate structure can include at least one of a capping layer, a work function metal layer, a glue layer, and a metal fill layer. In some embodiments, the conductive intermediate structure can be formed on a gate dielectric layer at the metal boundary. In some embodiments, the conductive intermediate structure can include at least one of silicon (Si), silicon-titanium (SiTi), titanium (Ti), titanium nitride (TiN), titanium carbo nitride (TiCN), titanium silicon nitride (TiSiN), silicon-tantalum (SiTa), tantalum (Ta), tantalum nitride (TaN), tantalum carbo nitride (TaCN), tungsten nitride (WNx), tungsten carbo nitride (WCN), Ruthium (Ru), cobalt (Co), and tungsten (W).

Figure 1B:
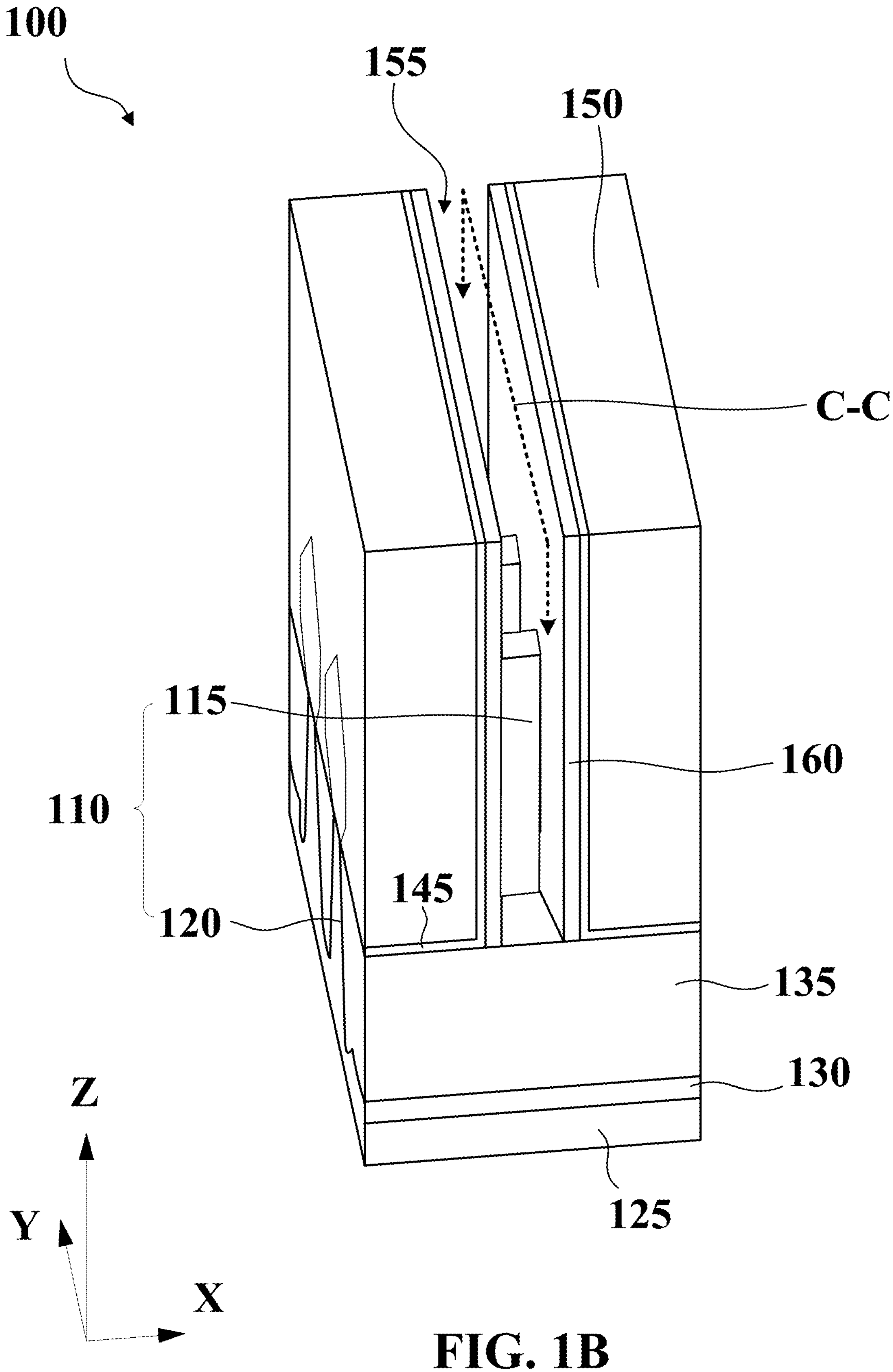
Figure 1C:
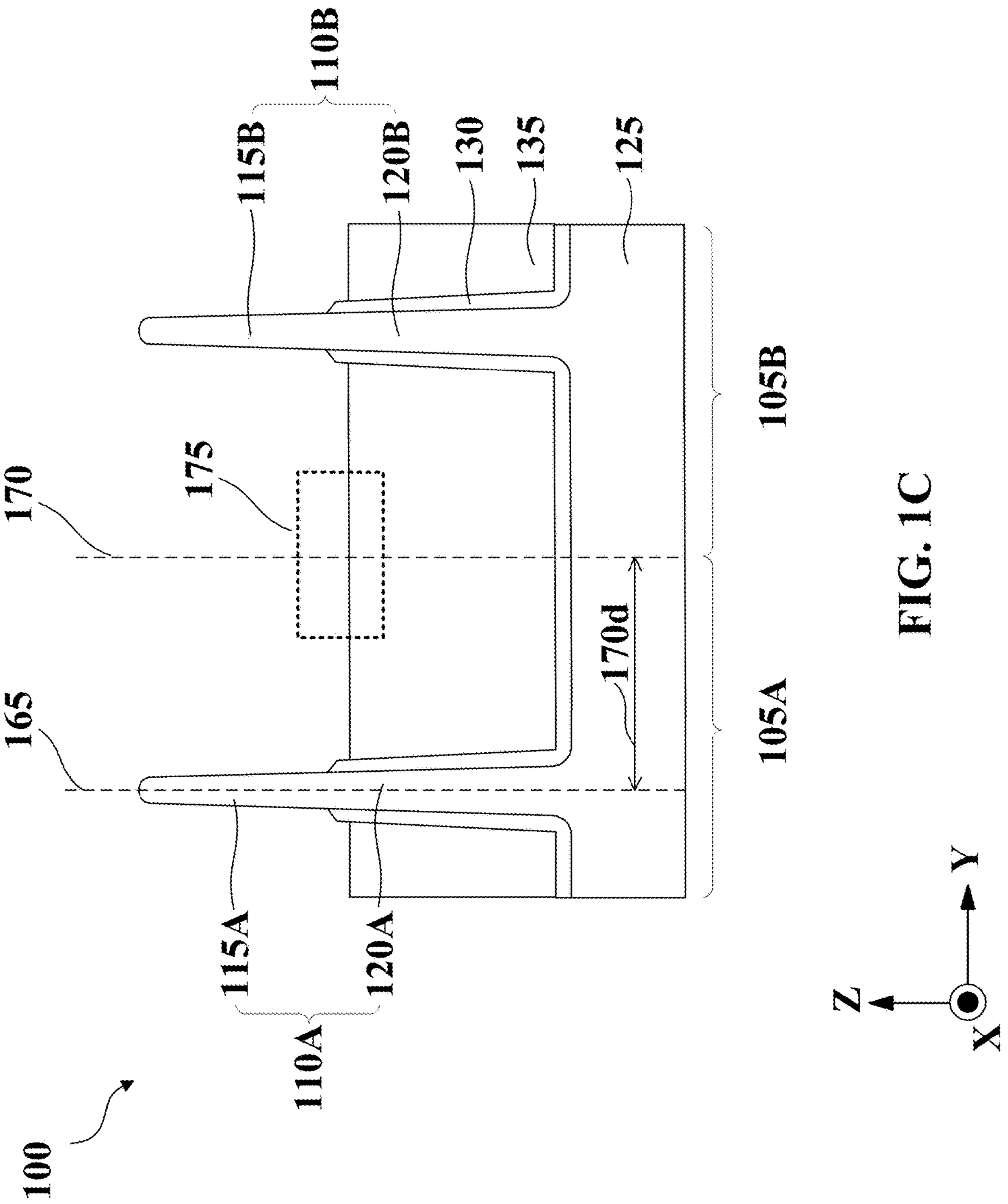

FIGS. 1A and 1B illustrate isometric views of a partially fabricated semiconductor device 100 after the removal of a sacrificial gate stack, in accordance with some embodiments. In some embodiments, FIG. 1B shows partially fabricated semiconductor device 100 of FIG. 1A after being rotated clock wise around the Z-axis by about 45°. In other words, FIG. 1B is another view of fabricated semiconductor device 100 shown in FIG. 1A. FIG. 1C illustrates a cross-sectional view along line C-C of the partially fabricated semiconductor device 100, according to some embodiments.

As shown in FIGS. 1A-1C, partially fabricated semiconductor device 100 includes a FET 105A and a FET 105B formed on a substrate 125. In some embodiments, FETs 105A and 105B can be fabricated with different gate work function stacks for different $V_t$. In some embodiments, FETs 105A and 105B can be planar FETs, finFETs, gate-all-around finFETs (GAA finFETs), or other suitable FET devices. In some embodiments, FETs 105A and 105B can be both p-type FETs (PFETs), both n-type FETs (NFETs), or one of each conductivity type FET with different $V_t$. In some embodiments, FET 105A can be a p-type FET (also referred to as "PFET 105A"), FET 105B can be an n-type FET (also referred to as "NFET 105B"), and semiconductor device 100 can be part of an inverter logic device. Though FIGS. 1A-1C show two FETs, semiconductor device 100 can have any number of FETs. Also, though FIGS. 1A-1C show one gate stack opening 155, semiconductor device 100 can have additional gate stack openings similar and parallel to gate stack opening 155. The discussion of elements of FETs 105A and 105B with the same annotations applies to each other, unless mentioned otherwise.

As shown in FIGS. 1A-1C, FET 105A and FET 105B can be formed on substrate 125. In some embodiments, substrate 125 can include a semiconductor material such as crystalline silicon. In some embodiments, substrate 125 can include (i) an elementary semiconductor, such as germanium (Ge); (ii) a compound semiconductor including silicon carbide (SiC), silicon arsenide (SiAs), gallium arsenide (GaAs), gallium phosphide (GaP), indium phosphide (InP), indium arsenide (InAs), indium antimonide (InSb), and/or a III-V semiconductor material; (iii) an alloy semiconductor including silicon germanium (SiGe), silicon germanium carbide (SiGeC), germanium stannum (GeSn), silicon germanium stannum (SiGeSn), gallium arsenic phosphide (GaAsP), gallium indium phosphide (GaInP), gallium indium arsenide (GaInAs), gallium indium arsenic phosphide (GaInAsP), aluminum indium arsenide (AlInAs), and/or aluminum gallium arsenide (AlGaAs); (iv) a silicon-on-insulator (SOI) structure; (v) a silicon germanium (SiGe)-on insulator structure (SiGeOI); (vi) germanium-on-insulator (GeOI) structure; or (vii) a combination thereof. Alternatively, the substrate may be made from an electrically non-conductive material, such as glass and sapphire wafer. Further, substrate 125 can be doped depending on design requirements (e.g., p-type substrate or n-type substrate). In some embodiments, substrate 125 can be doped with p-type dopants (e.g., boron, indium, aluminum, or gallium) or n-type dopants (e.g., phosphorus or arsenic). For example purposes, substrate 125 will be described in the context of crystalline silicon (Si). Based on the disclosure herein, other materials, as discussed above, can be used. These materials are within the spirit and scope of this disclosure.

Referring to FIGS. 1A-1C, semiconductor device 100 can include additional structural elements, such as fin structures 110, a liner 130, an insulating layer 135, source/drain (S/D) epitaxial fin structures 140, an etch stop layer 145, an isolation layer 150, a gate stack opening 155 formed in isolation layer 150, and gate spacers 160 formed on sidewall surfaces of isolation layer 150 in gate stack opening 155.

Fin structures 110 can include fin top portions 115 and fin base portions 120, as shown in FIGS. 1A-1C. In some embodiments, fin top portions 115 can be a single fin structure. In some embodiments, fin top portions 115 can include a stack of semiconductor layers (e.g., a stack of nanosheets, nanowires, or nano-fork sheets for GAA finFETs). In some embodiments, fin top portions 115 can include semiconductor materials similar to or different from fin base portions 120. In some embodiments, fin top portions 115 and fin base portions 120 can include a semiconductor material the same as substrate 125, such as crystalline Si.

Fin structures 110 may be formed by patterning with any suitable method. For example, fin structures 110 may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern fin structures 110.

In some embodiments, insulating layer 135 can be an isolation structure, such as a shallow trench isolation (STI), that provides electrical isolation between FET 105A and FET 105B from each other and from neighboring FETs with different fin structures (not shown) on substrate 125 and/or neighboring active and passive elements (not shown) integrated with or deposited on substrate 125. In some embodiments, an insulating layer can be a layer that functions as an electrical insulator (e.g., a dielectric layer). In some embodiments, insulating layer 135 can include silicon oxide ($SiO_2$), silicon nitride ($Si_3N_4$), silicon oxy-nitride (SiON), fluorine-doped silicate glass (FSG), phosphorous-doped silicate glass (PSG), a low-k dielectric material (e.g., with k-value less than about 3.9), and/or other suitable dielectric materials with appropriate fill properties. In some embodiments, liner 130 is a nitride layer, such as silicon nitride.

Referring to FIGS. 1A-1C, S/D epitaxial fin structures 140 can be disposed on fin base portions 120 and abut gate spacers 160, extending along an X-axis within isolation layer 150. In some embodiments, S/D epitaxial fin structures 140 can have any geometric shape, such as a polygon, an ellipsis, and a circle. S/D epitaxial fin structures 140 can include an epitaxially-grown semiconductor material. In some embodiments, the epitaxially grown semiconductor material includes the same material as substrate 125. In some embodiments, the epitaxially-grown semiconductor material includes a different material from substrate 125. In some embodiments, the epitaxially-grown semiconductor material for each of S/D epitaxial fin structures 140 can be the same as or different from each other. The epitaxially-grown semiconductor material can include: (i) a semiconductor material, such as germanium and silicon; (ii) a compound semiconductor material, such as gallium arsenide and aluminum gallium arsenide; or (iii) a semiconductor alloy, such as silicon germanium and gallium arsenide phosphide.

In some embodiments, S/D epitaxial fin structures 140 can be p-type for FET 105A (also referred to as "p-type S/D epitaxial fin structures 140A") and S/D epitaxial fin structures 140 can be n-type for FET 105B (also referred to as "n-type S/D epitaxial fin structures 140B"). In some embodiments, p-type S/D epitaxial fin structures 140A can include SiGe and can be in-situ doped during an epitaxial growth process using p-type dopants, such as boron, indium, and gallium. In some embodiments, p-type S/D epitaxial fin structures 140A can have multiple sub-regions that can include SiGe and can differ from each other based on, for example, doping concentration, epitaxial growth process conditions, and/or a relative concentration of Ge with respect to Si. In some embodiments, n-type S/D epitaxial fin structures 140B can include Si and can be in-situ doped during an epitaxial growth process using n-type dopants, such as phosphorus and arsenic. In some embodiments, n-type S/D epitaxial fin structures 140B can have multiple n-type epitaxial fin sub-regions that can differ from each other based on, for example, doping concentration and/or epitaxial growth process conditions.

Referring to FIGS. 1A-1C, fin structures 110A and 110B can be current-carrying structures for respective FET 105A and FET 105B. Channel regions of FET 105A and FET 105B can be formed in portions of their respective fin top portions 115A and 115B in gate stack opening 155. S/D epitaxial fin structures 140A and 140B can function as S/D regions of respective FET 105A and FET 105B.

Referring to FIGS. 1A-1C, etch stop layer 145 can extend over insulating layer 135, S/D epitaxial fin structures 140, and gate spacers 160. In some embodiments, etch stop layer 145 can function as a layer to stop etch in a subsequent etching process during the formation of S/D contact openings on S/D epitaxial fin structures 140. In some embodiments, etch stop layer 145 can have a thickness that ranges from about 3 nm to about 5 nm. In some embodiments, etch stop layer 145 can be deposited by a conformal deposition process, such as atomic layer deposition (ALD), plasma-enhanced ALD (PEALD), chemical vapor deposition (CVD), plasma-enhanced CVD (PECVD), and any other suitable deposition method.

Isolation layer 150 can surround S/D epitaxial fin structures 140 and be formed prior to the formation of gate stack opening 155. After the removal of sacrificial gate stacks (not shown), gate stack opening 155 can be formed in isolation layer 150, as shown in FIGS. 1A and 1B. In some embodiments, isolation layer 150 can be an interlayer dielectric (ILD) that includes a silicon oxide-based dielectric material with or without carbon and/or nitrogen. In some embodiments, isolation layer 150 can be deposited by CVD, physical vapor deposition (PVD), or any other suitable deposition method.

Gate spacers 160 can be a stack of one or more layers that include the same or different materials. In some embodiments, gate spacers 160 can include a dielectric material, such as silicon oxynitride (SiON), silicon carbon nitride (SiCN), silicon oxycarbide (SiOC), silicon nitride, or a combination thereof. In some embodiments, gate spacers 160 can have a thickness ranging from about 2 nm to about 5 nm. According to some embodiments, gate spacers 160 can be deposited on sidewall surfaces of sacrificial gate stacks, which are later removed during a gate replacement process to form gate stack opening 155. In FIGS. 1A-1C, gate spacers 160 function as structural elements for the metal gate stack to be formed in gate stack opening 155 in subsequent processes.

Referring to FIG. 1C, semiconductor device 100 can further include a metal boundary 170 between FETs 105A and 105B. Metal boundary 170 can be a boundary where gate metal stacks of FET 105A border gate metal stacks of FET 105B, for example, N-P metal boundary between PFET 105A and NFET 105B. In some embodiments, metal boundary 170 can be at the middle between fin structures 110A and 110B. In some embodiments, a metal boundary to channel distance (MBD) 170*d* along a Y-axis between metal boundary 170 and an adjacent channel, such as fin structures 110A, can range from about 35 nm to about 25 μm. In some embodiments, the adjacent channel can be a channel of planar FETs, finFETs, nanowire FETs, or nanosheet FETs. Fabrication processes of gate metal stacks for FETs 105A and 105B at metal boundary 170 will be described in details at region 175 shown in FIG. 1C.

FIG. 2 is a flow diagram of method 200 for fabricating a semiconductor device having metal boundary trench isolation with conductive intermediate structures, according to some embodiments. It is noted that method 200 may not be limited to finFET devices and can be applicable to devices that would benefit from metal boundary trench isolation with intermediate structures, such as planar FETs, GAA finFETs, etc. Additional fabrication operations may be performed between various operations of method 200 and may be omitted merely for clarity and ease of description. It is to be appreciated that additional processes can be provided before, during, and/or after method 200; one or more of these additional processes are briefly described herein. Moreover, not all operations may be needed to perform the disclosure provided herein. Additionally, some of the operations may be performed simultaneously or in a different order than shown in FIG. 2. In some embodiments, one or more other operations may be performed in addition to or in place of the presently described operations.

For illustrative purposes, the operations illustrated in FIG. 2 will be described with reference to the example fabrication process for fabricating semiconductor device 100 having metal boundary trench isolation with an electrically conductive intermediate structures to block metal diffusion as illustrated in FIGS. 3A-8H. FIGS. 3A, 4, 5A, 6, 7A, and 7B illustrate cross-sectional views of region 175 of semiconductor device 100 having metal boundary trench isolation with conductive intermediate structures at various stages of its fabrication process, in accordance with some embodiments. FIGS. 3B, 3C, 5B, and 5C illustrate various top-down views of semiconductor device 100 having metal boundary trench isolation with conductive intermediate structures at various stages of its fabrication process, in accordance with some embodiments. FIGS. 8A-8H illustrate cross-sectional views of region 175 of semiconductor device 100 having metal boundary trench isolation with various electrically conductive intermediate structures to block metal diffusion, in accordance with some embodiments. Although FIGS. 3A-8H illustrate fabrication processes of semiconductor device 100 having metal boundary trench isolation with various intermediate structures, method 200 can be applied to other semiconductor devices, such as an inverter logic device, a NOR logic device, a NAND logic device, a ring oscillator device, and an SRAM device, which can be formed by connecting adjacent NFET and PFET devices with different $V_t$. Elements in FIGS. 3A-8H with the same annotations as elements in FIGS. 1A-1C are described above.

Figure 3A:
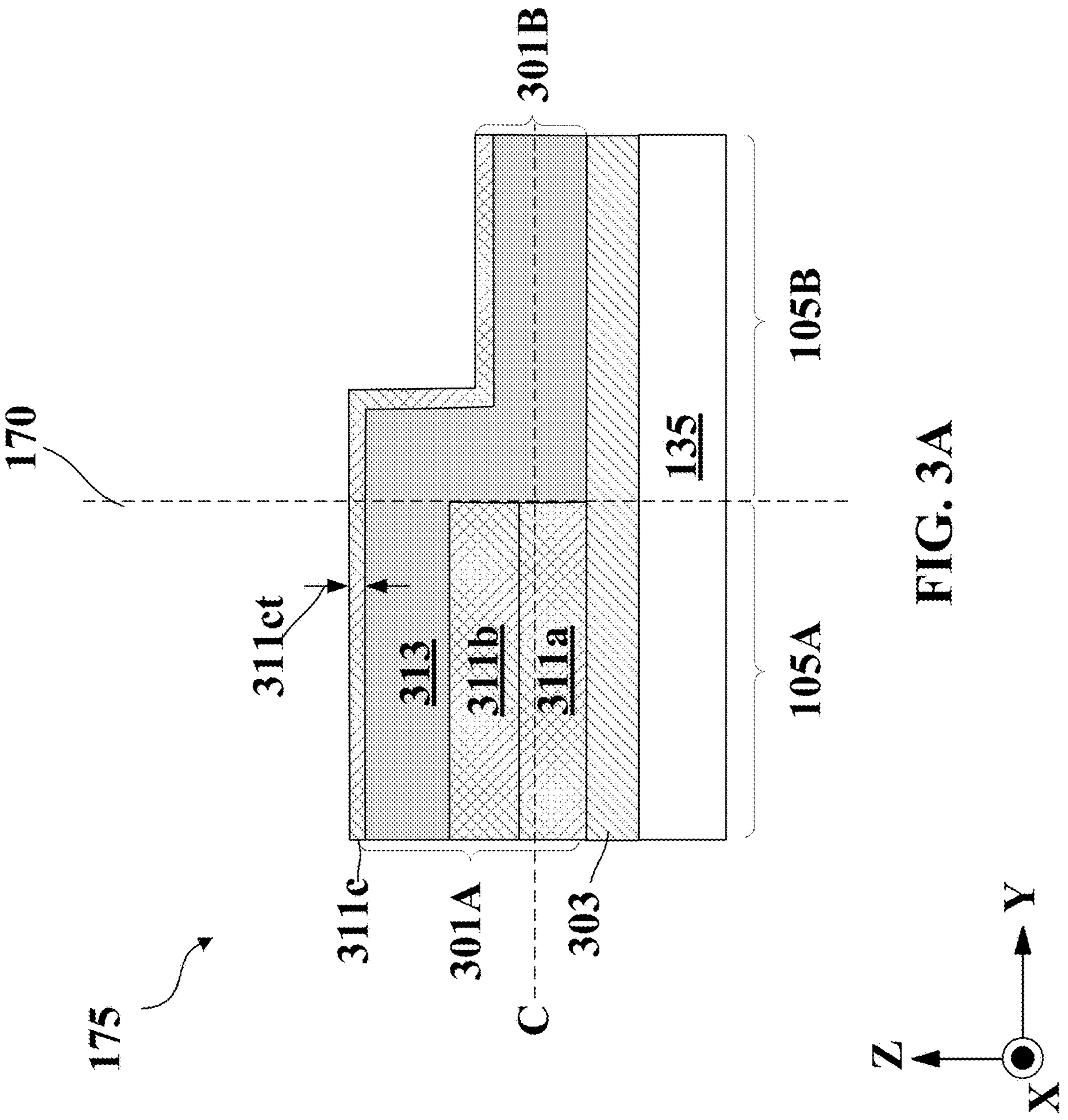
FIGS. 3A, 4, 5A, 6, 7A, and 7B illustrate various cross-sectional views of a semiconductor device having metal boundary trench isolation with conductive intermediate structures at various stages of its fabrication process, in accordance with some embodiments.
Figure 3C:
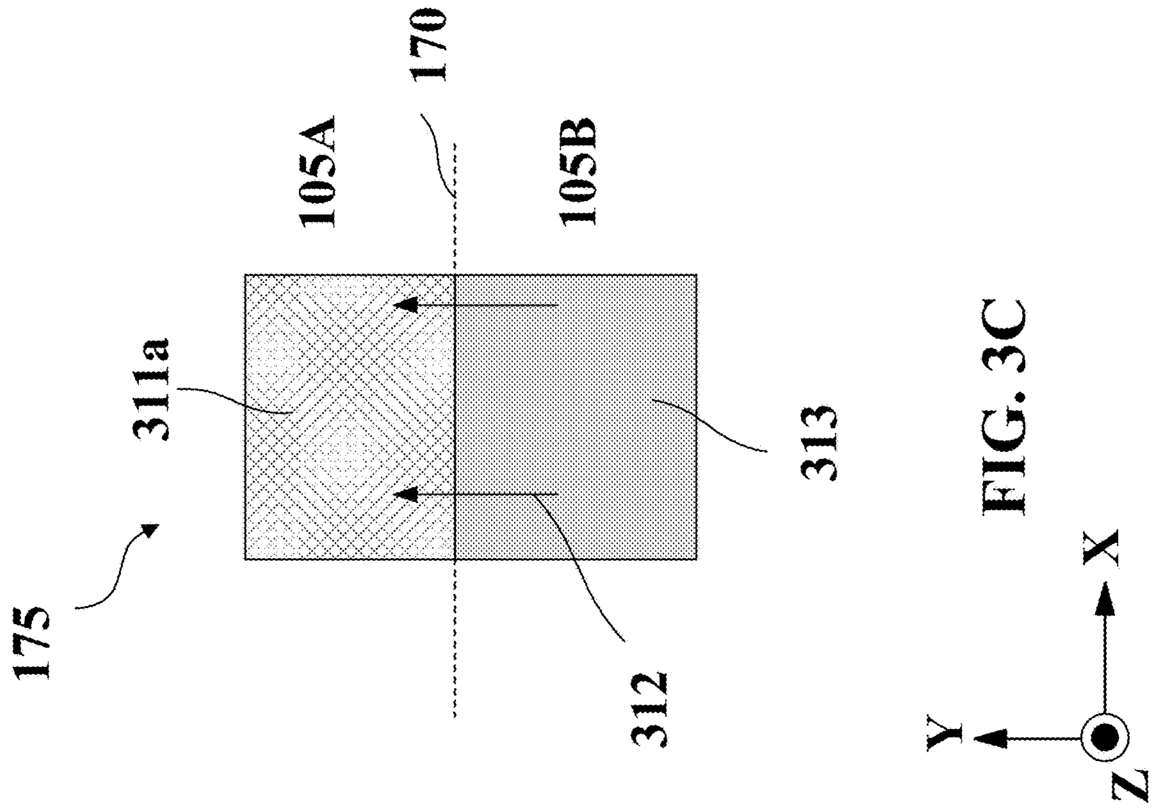
FIGS. 3B, 3C, 5B, and 5C illustrate various top-down views of a semiconductor device having metal boundary trench isolation with conductive intermediate structures at various stages of its fabrication process, in accordance with some embodiments.
Figure 3B:
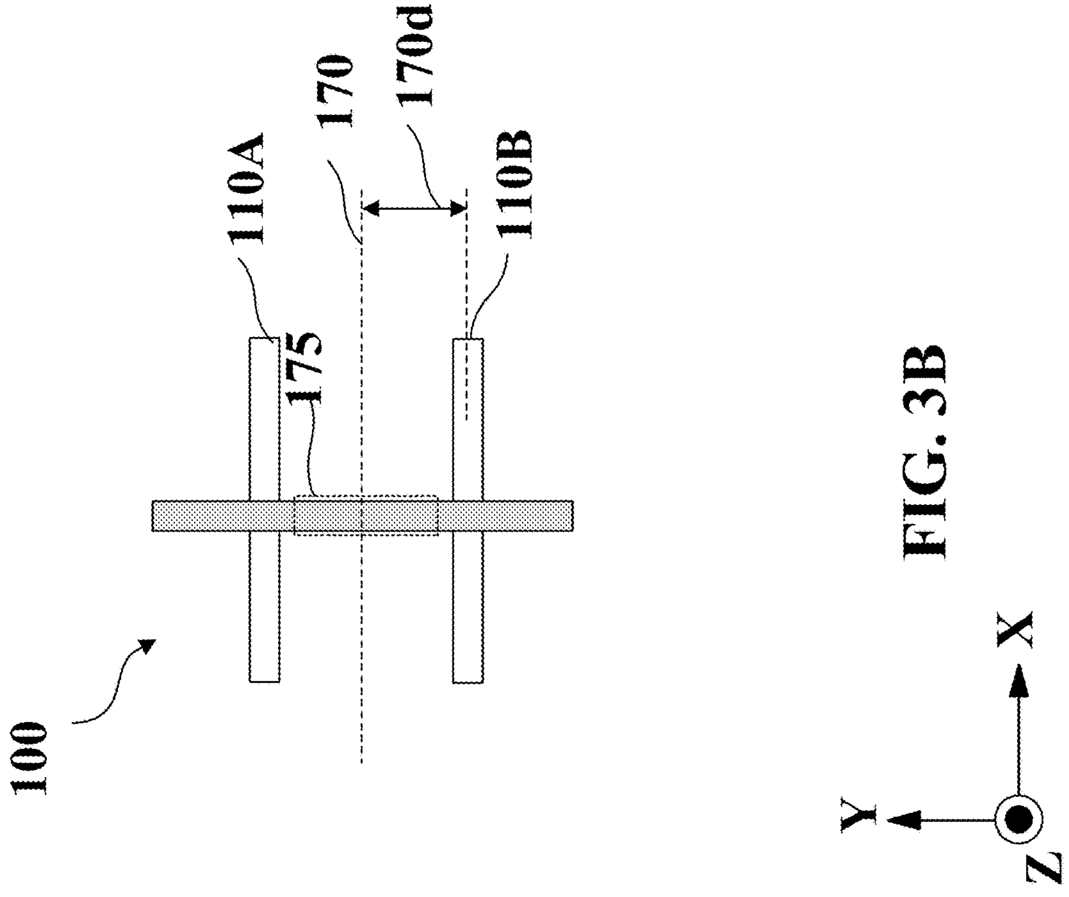

Referring to FIG. 2, method 200 begins with operation 210 and the process of forming a gate dielectric layer on fin structures 110A, fin structures 110B, and insulating layer 135 between fin structures 110A and fin structures 110B within gate stack opening 155 as shown in FIGS. 1A-1C. According to some embodiments, FIG. 3A is a cross-sectional view of region 175 of semiconductor device 100 shown in FIG. 1C after operation 210 of method 200, FIG. 3B is a top-down view of semiconductor device 100 shown in FIG. 1C after operation 210 of method 200, and FIG. 3C is a top-down view of region 175 of semiconductor device 100 at level C in FIG. 3A after operation 210 of method 200. In some embodiments, arrows 312 in FIG. 3C can indicate a direction of metal diffusion (e.g., aluminum, titanium, etc.) across metal boundary 170 from FET 105B to FET 105A. In some embodiments, various structures formed on insulating layer 135 of FET 105A and FET 105B in FIGS. 3A-3C represent the structures formed on fin structures 110A and 110B (not shown) respectively.

According to FIGS. 3A-3C, gate dielectric layer 303 can be formed on fin structures 110 and insulating layer 135 between gate spacers 160. In some embodiments, gate dielectric layer 303 can be a gate dielectric stack that includes an interfacial layer and a high-k layer. In some embodiments, the interfacial layer can include a silicon oxide layer with a thickness from about 5 Å to about 15 Å and deposited by ALD, CVD, or any other suitable deposition method. As a result of the deposition process, the silicon oxide layer can cover fin structures 110 and insulating layer 135. In some embodiments, the interfacial layer can be formed by exposing the silicon surfaces of fin structures 110 to an oxidizing ambient. In some embodiments, the oxidizing ambient can include a combination of ozone ($O_3$), ammonia hydroxide/hydrogen peroxide/water mixture (SC1), and hydrochloric acid/hydrogen peroxide/water mixture (SC2). As a result of the aforementioned oxidation process, a silicon oxide layer between about 5 Å and about 15 Å can be formed on exposed silicon surfaces, such as the surfaces of fin structures 110 in gate stack opening 155, but not on insulating layer 135. Therefore, gate dielectric layer 303 on fin structures 110 can include the interfacial layer and the high-k layer, and gate dielectric layer 303 on insulating layer 135 can include the high-k layer. In some embodiments, the high-k layer can include a dielectric material with a dielectric constant (k-value) higher than about 3.9. In some embodiments, the high-k layer can include hafnium oxide, lanthanum oxide, aluminum oxide, yttrium oxide, zirconium oxide, scandium oxide, or combinations thereof deposited by ALD or PEALD at a thickness from about 10 Å to about 20 Å.

Referring to FIG. 2, method 300 continues with operation 220 and the process of forming a first work function stack and a second work function stack on the gate dielectric layer over the first fin structure and the second fin structure, respectively. As shown in FIGS. 1C and 3, work function stack 301A for FET 105A and work function stack 301B for FET 105B can be formed on gate dielectric layer 303 over insulating layer 135 and respective fin structures 110A and 110B.

In some embodiments, the formation of work function stacks 301A and 301B can include formation of aluminum-free work function layers 311*a* and 311*b*, an aluminum-based work function layer 313, and a shield layer 311*c*. In some embodiments, aluminum-free can refer to an aluminum level below a threshold value, such as about 1.2 atomic percent. In some embodiments, aluminum-free work function layers 311*a* and 311*b* can also be referred to as "p-type work function layers 311*a* and 311*b*," referring to work function layers responsible for tuning, primarily, the threshold voltage of p-type FETs (and to a much lesser degree the threshold voltage of the n-type FETs). In some embodiments, p-type work function layers are present on both n-type and p-type FETs (not shown). In some embodiments, each of p-type work function layers 311*a* and 311*b* can include titanium, tungsten, tantalum, ruthium and/or nitrogen (e.g., in the form of titanium nitride (TiN)) and has a thickness between about 5 Å and about 35 Å. In some embodiments, each of p-type work function layers 311*a* and 311*b* can include materials having work function greater than about 4.4 eV.

The threshold voltage tuning for a FET device can be accomplished by controlling the composition of the work function layers, the number of p-type work function layers, and/or the total thickness of the p-type work function layers. For example, the greater the number of p-type work function layers in work function stack 301A or the thicker the p-type work function layers, the lower the absolute threshold voltage value for a PFET device and the higher the absolute threshold voltage value for an NFET device. Though FIGS. 3A-3C and subsequent figures show two p-type work function layers 311*a* and 311*b* in work function stack 301A and no p-type work function layers in work function stack 301B, work function stack 301A and work function stack 301B can include any number of p-type work function layers respectively. Work function stack 301A and work function stack 301B can include different numbers of p-type work function layers from each other. Therefore, it is possible to form, within the same chip, FET devices with different threshold voltages for different power applications as discussed above. As discussed above, p-type work function layers tune primarily the threshold voltage of p-type FETs, while n-type FETs may be unaffected by the presence of the p-type work function layers. In some embodiments, n-type FETs can have fewer number of p-type work function layers, or feature a thinner p-type work function layer, compared to the p-type FETs. In some embodiments, each of p-type work function layers 311*a* and 311*b* can be deposited with an ALD process using titanium tetrachloride ($TiCl_4$) and ammonia ($NH_3$) at a deposition temperature between about 300° C. and about 550° C. Further, removal of the p-type work function layer can be achieved with an SC1, an SC2, or a phosphoric acid wet clean after the removal of the photoresist. As discussed above, each of p-type work function layers 311*a* and 311*b* can have a different thickness because each layer is individually deposited.

FET devices with a different number of p-type work function layers, or with a p-type work function layer having different thicknesses, can be accomplished by photolithography and etching operations. In some embodiments, the first p-type work function layer can be deposited concurrently on both n-type and p-type FET devices of the chip. In some embodiments, transistors receiving more p-type work function layers (e.g., FET 105A in FIG. 3A) are subsequently masked with a photoresist so that the first p-type work function layer can be removed via etching from the transistors receiving fewer p-type work function layers (e.g., FET 105B in FIG. 3A). Once the first p-type work function layer has been removed from the transistors receiving fewer p-type work function layers (e.g., FET 105B in FIG. 3A), the photoresist is removed from the transistors receiving more p-type work function layers (e.g., FET 105A in FIG. 3A) and the process resumes with a second p-type work function layer deposition. A photoresist is subsequently used to mask the transistors receiving the largest and the second largest number of p-type work function layers. A subsequent etching process removes the second p-type work function layer from the transistors receiving fewer p-type work function layers from the transistors with the largest and the second largest number of p-type work function layers. The aforementioned sequence repeats until all the FET devices (p-type and n-type) receive the appropriate number of p-type work function layers (e.g., 0 to 1 p-type work function layers for n-type FETs and 2 to 4 p-type work function layers for p-type FETs). The p-type work function formation sequence described above is not limiting and other sequences to form p-type work function layers 311*a* and 311*b* of work function stack 301A using similar or different operations may be performed. In some embodiments, p-type work function layers can be formed both before and after the formation of n-type work function layers.

Following the process described above, aluminum-based work function layer 313 can be deposited concurrently on FETs 105A and 105B, as shown in FIG. 3A. In some embodiments, aluminum based work function layer 313 can also be referred to as "n-type work function layer 313," referring to work function layers responsible for tuning, primarily, the threshold voltage of n-type FETs. In some embodiments, n-type work function layer 313 can be present on both FETs 105A and 105B as shown in FIG. 3A. Material composition (e.g., aluminum concentration) in the layers of work function stacks 301A and 301B can tune threshold voltages of FETs 105A and 105B. In some embodiments, n-type work function layer 313 can include aluminum and/or titanium (e.g., in the form of titanium aluminum (TiAl)), TiAlC, TaAl, or TaAlC and have a thickness between about 15 Å and about 35 Å. In some embodiments, n-type work function layer 313 can include materials having work function less than about 4.4 eV. As shown in FIG. 3A, after deposition of aluminum-based work function layer 313, aluminum-free work function layers 311*a* of FET 105A can be in contact with aluminum-based work function layer 313 of FET 105B at metal boundary 170. In some embodiments, aluminum in aluminum-based work function layer 313 of FET 105B can diffuse in subsequent processes across metal boundary 170 and into aluminum-free work function layers 311*a* and 311*b* of FET 105A, thus shifting the threshold voltage of FET 105A and FET 105B.

The deposition of aluminum-based work function layer 313 can be followed by depositing shield layer 311*c*, as shown in FIG. 3A. In some embodiments, shield layer 311*c* can include intrinsic TiN (iTiN), tungsten nitride (WN), tantalum nitride (TaN), or other suitable materials to allow patterning of aluminum-based work function layer 313 and protect aluminum-based work function layer 313 from contaminations and damages in subsequent processes, such as BARC contamination and plasma damages of removing a hard mask layer. In some embodiments, shield layer 311*c* can include at least one of TiN, TiSiN, TaSiN, TaTiN, Si, TiC, SiC, MoN, TiSi, TaSi, NiSi, MoSi, WSi. In some embodiments, shield layer 311*c* can have a thickness 311*ct* ranging from about 5 Å to about 60 Å. If thickness 311*ct* is less than about 5 Å, shield layer 311*c* may not provide sufficient protection to aluminum-based work function layer 313 against contaminations and damages in subsequent processes. If thickness 311*ct* is greater than about 60 Å, the protection provided by shield layer 311*c* may saturate and not improve at higher thicknesses.

Referring to FIG. 2, method 200 continues with operation 230 and the process of forming a trench between the first work function stack and the second work function stack. As shown in FIGS. 4 and 5A-5C, trench 570 can be formed at metal boundary 170 between work function stack 301A and work function stack 301B. In some embodiments, the formation of trench 570 can include forming an opening 470 in hard mask layer 417 and etching work function stacks 301A and 301B in opening 470 at metal boundary 170.

Figure 4:
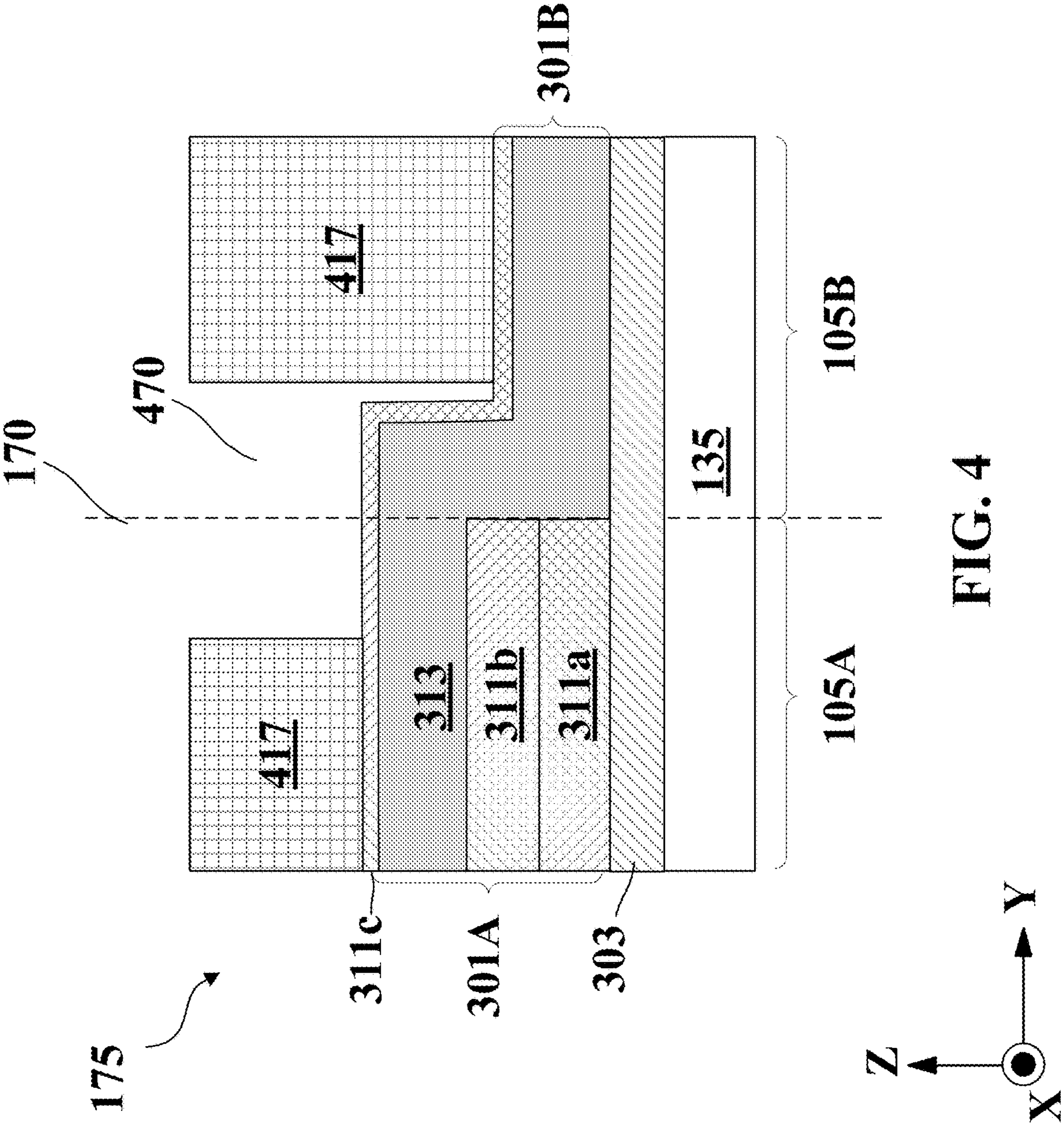

Referring to FIG. 4, the formation of opening 470 in hard mask layer 417 can include depositing hard mask layer 417 on work function stacks 301A and 301B and photo exposure and etching hard mask layer 417 at metal boundary 170. In some embodiments, hard mask layer 417 can include a bottom anti-reflective coating (BARC) layer and/or a hexamethyldisilazane (HMDS) layer. A photoresist layer can be patterned on hard mask layer 417 to form opening 470. In some embodiments, an immersion photolithography process with ArF source at about 193 nm with an energy of about 6 to 7 eV can be used for the formation of a trench with dimensions greater than about 19 nm. In some embodiments, an extreme ultra-violet (EUV) photolithography process with a carbon dioxide ($CO_2$) laser and tin (Sn) plasma EUV from about 10 nm to 13.5 nm with an energy of about 90 eV to about 95 eV can be used for the formation of a trench with dimensions greater than about 11 nm. In some embodiments, hard mask layer 417 in the photo-exposed region can be etched by a nitrogen and hydrogen plasma with chlorine, carbon fluoride, and an optional substrate bias to form opening 470.

Figure 5A:
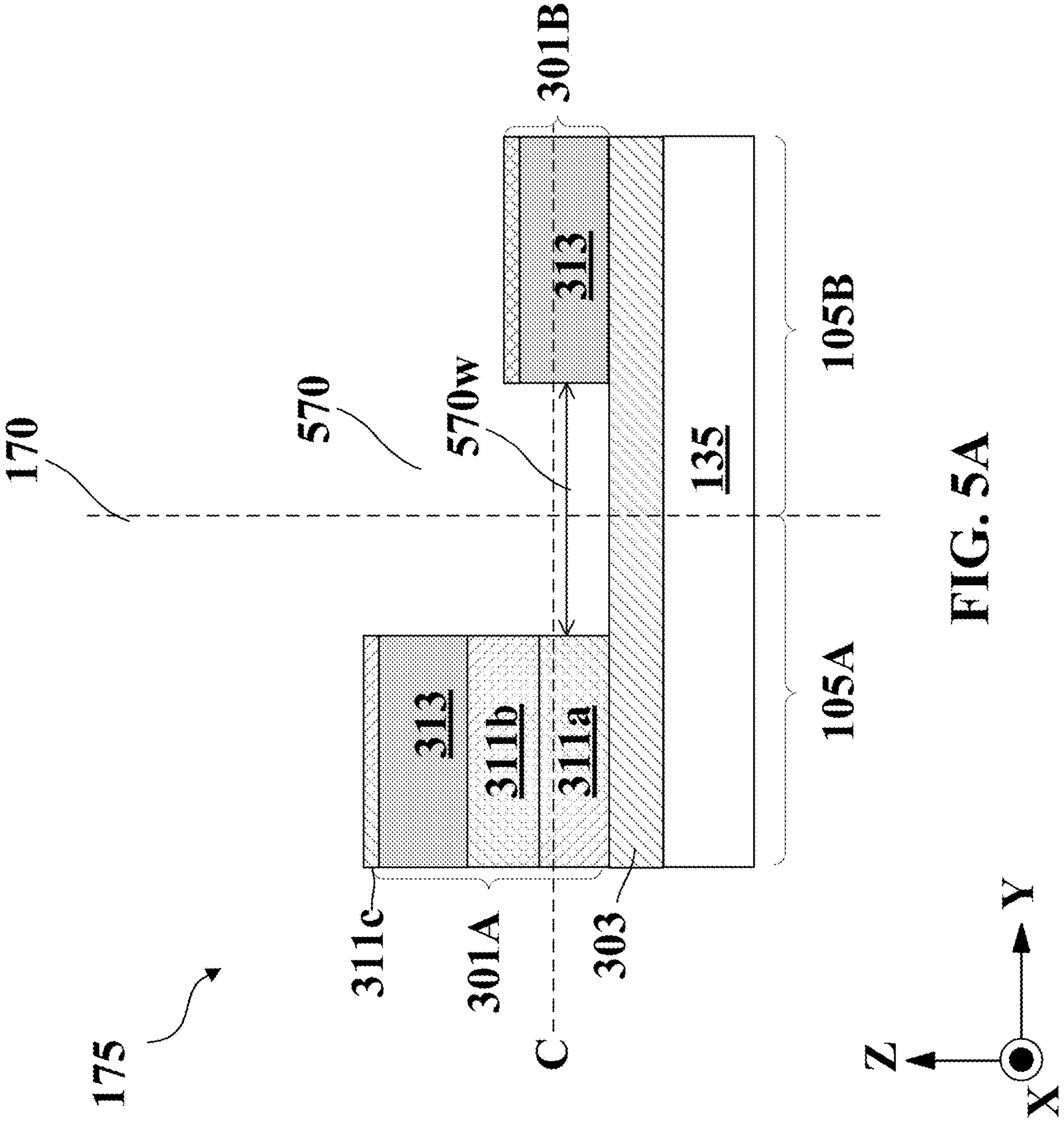
Figure 5C:
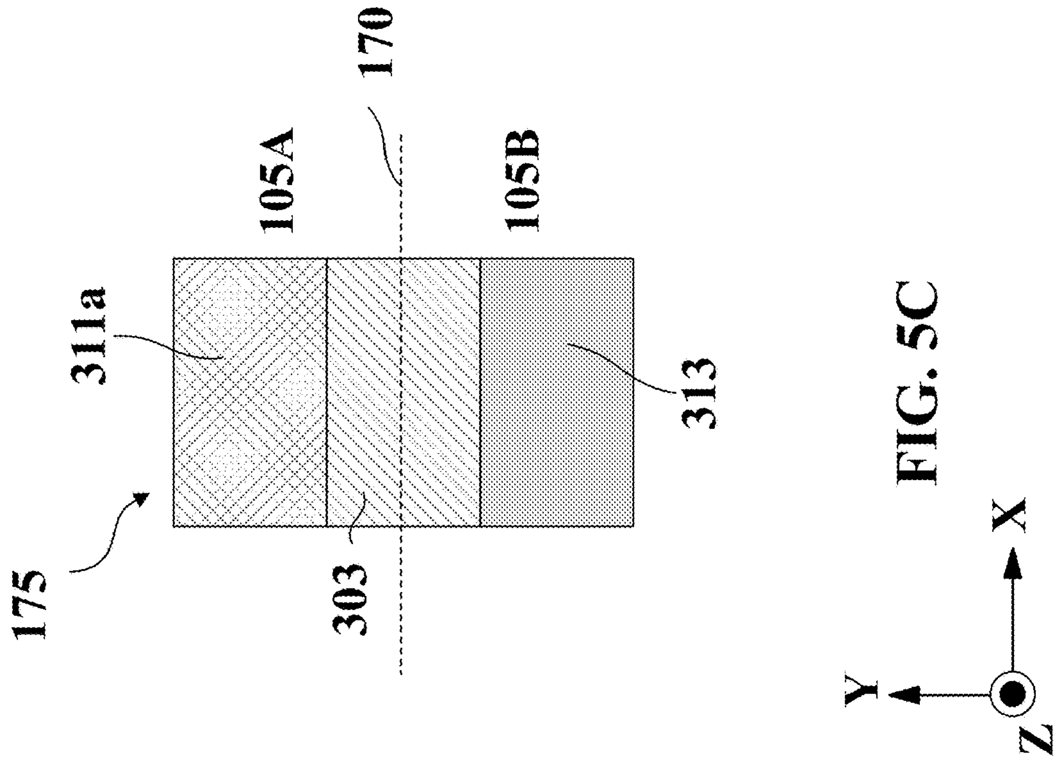
Figure 5B:
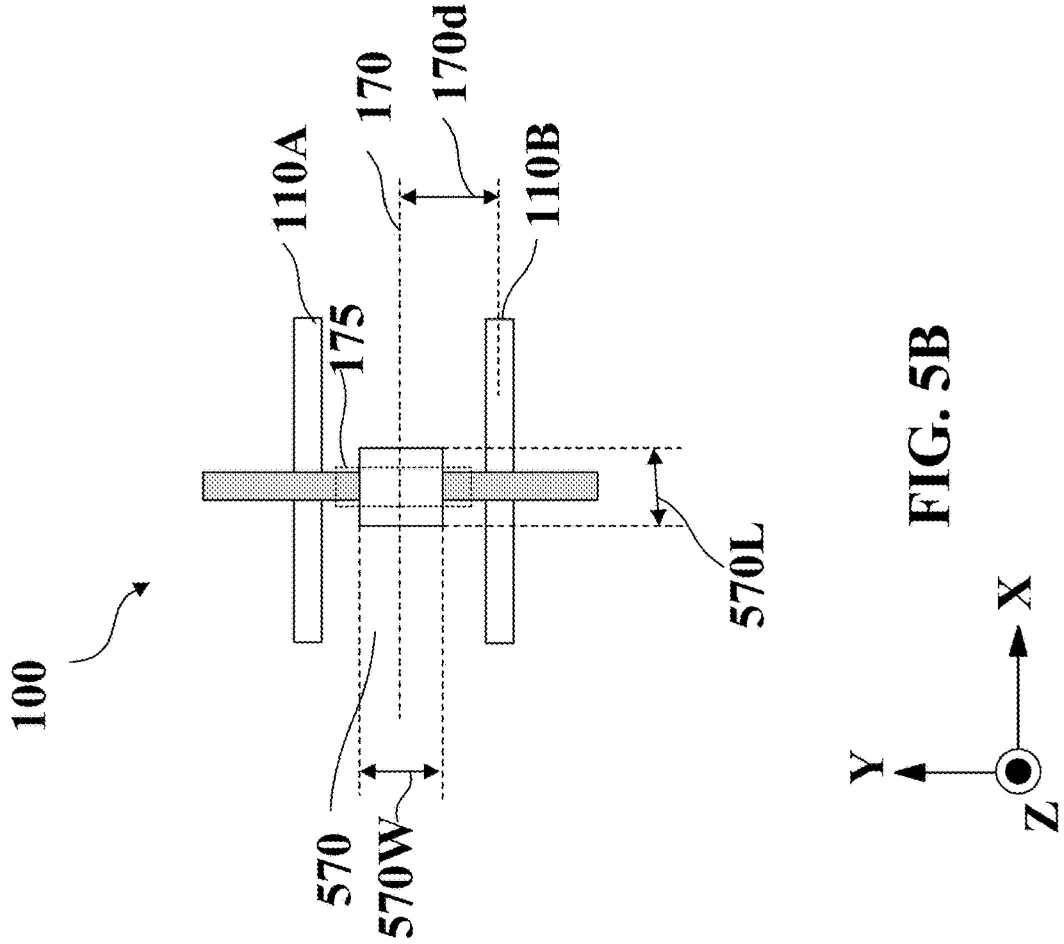

The formation of opening 470 can be followed by etching work function stacks 301A and 301B to form trench 570, as shown in FIGS. 5A-5C. According to some embodiments, FIG. 5A is a cross-sectional view of region 175 after operation 230, FIG. 5B is a top-down view of semiconductor device 100 after operation 230, and FIG. 5C is a top-down view of region 175 at level C in FIG. 5A after operation 230. In some embodiments, work function stacks 301A and 301B can be etched by a wet etching process. In some embodiments, the wet etching process can include a first etchant and/or a second etchant. In some embodiments, the first etchant can include hydrogen chloride and hydrogen peroxide. In some embodiments, the first etchant can have an etch selectivity between TiAl and TiN higher than about 4.5. In some embodiments, the second etchant can include hydrogen peroxide and phosphoric acid. In some embodiments, the second etchant can have an etch selectivity between TiN and TiAl higher than about 100. In some embodiments, the wet etching process can stop on gate dielectric layer 303 (e.g., the high-k layer). In some embodiments, gate dielectric layer 303 can be partially etched due to process variations during or after the wet etching process. In some embodiments, gate dielectric layer 303 can be partially removed by a thickness ranging from about 3 Å to about 7 Å. In some embodiments, a ratio of the thickness partially removed from gate dielectric layer 303 to the thickness of gate dielectric layer 303 can range from about 0.2 to about 0.5. The formation of trench 570 can be followed by removal of hard mask layer 417. In some embodiments, hard mask layer 417 can be removed by a plasma ashing process in a nitrogen and hydrogen plasma with chlorine, carbon fluoride, and no substrate bias. In some embodiments, the ash after the plasma ashing process can be cleaned by DI water, or DI water with diluted HF.

In some embodiments, trench 570 can have a width 570*w* along a Y-axis ranging from about 11 nm to about 90 nm. If width 570*w* is less than about 11 nm, subsequently formed conductive intermediate structure in trench 570 may not effectively block metal (e.g., aluminum, titanium, etc.) diffusion across metal boundary 170. If width 570*w* is greater than about 90 nm, portions of work function stack 301A over fin structures 110A and/or portions of work function stack 301B over fin structures 110B may be removed or affected by trench formation process, especially if metal boundary to channel distance 170*d* is less than about 195 nm. As a result, threshold voltages of FET 105A and/or 105B may be negatively affected.

In some embodiments, trench 570 can have a length 570L along an X-axis ranging from about 45 nm to about 800 nm. If length 570L is less than about 45 nm, subsequently formed electrically conductive intermediate structure 770 (shown in FIG. 7B) may not effectively block metal (e.g., aluminum and titanium) or contamination (e.g., carbon, chlorine, fluorine, and nitrogen) diffusion across metal boundary 170. If length 570L is greater than about 800 nm, portions of work function stacks of adjacent FET devices over fin structures may be removed. As a result, device performance of adjacent FET devices may be negatively affected. In some embodiments, length 570L can depend on a gate width along an X-axis of semiconductor device 100 and can be required to be greater than the gate width.

Figure 6:
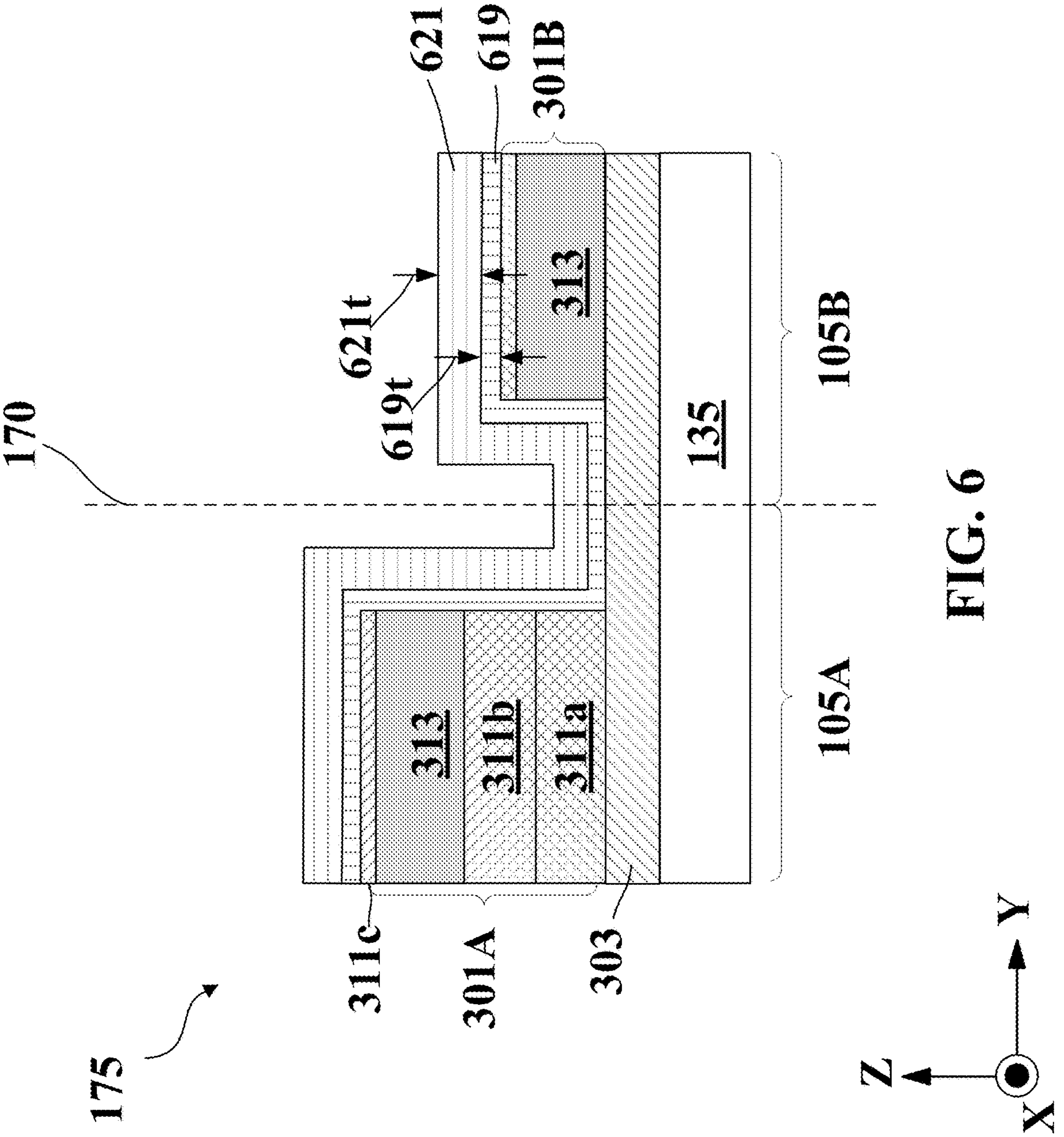
Figure 7A:
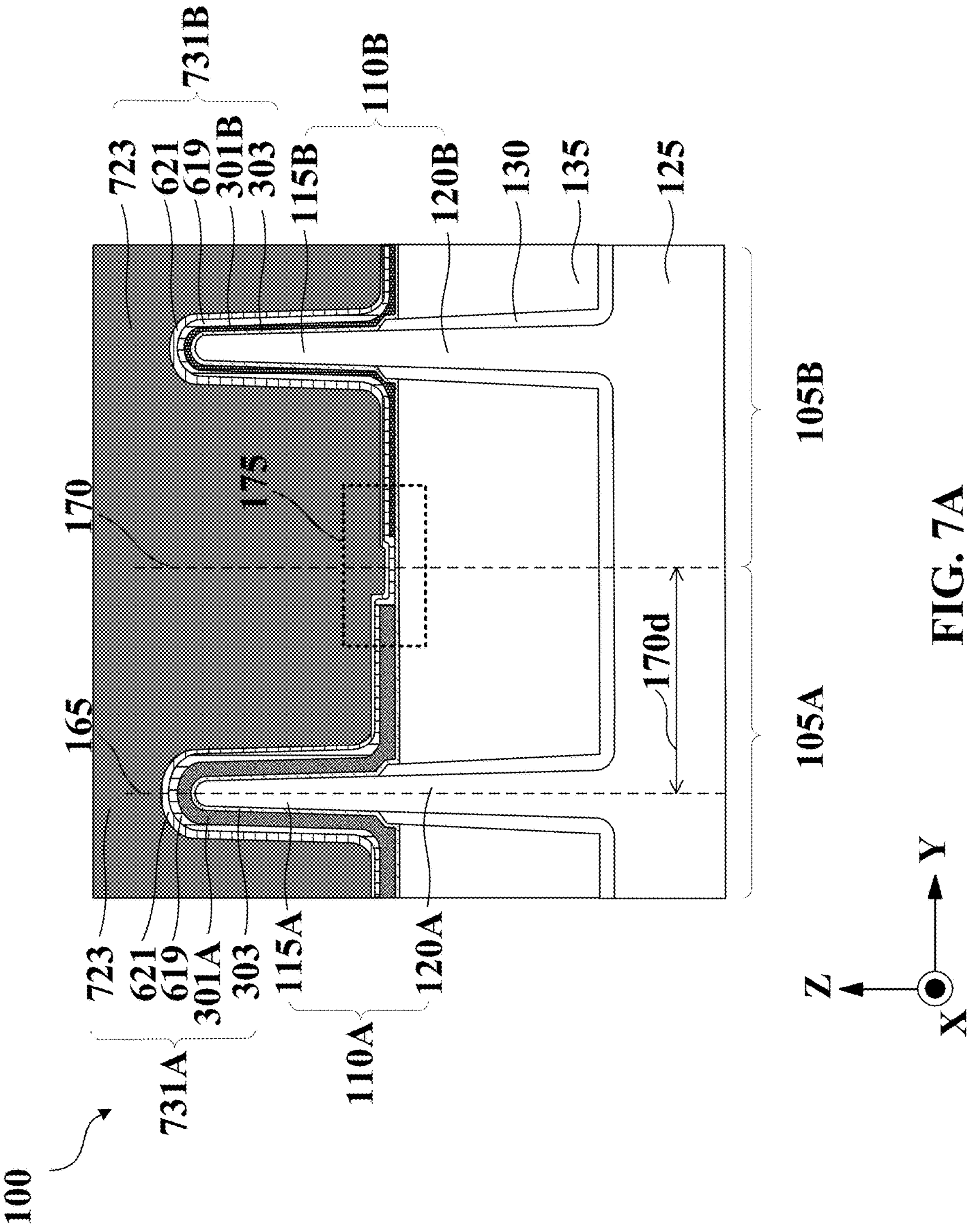
Figure 7B:
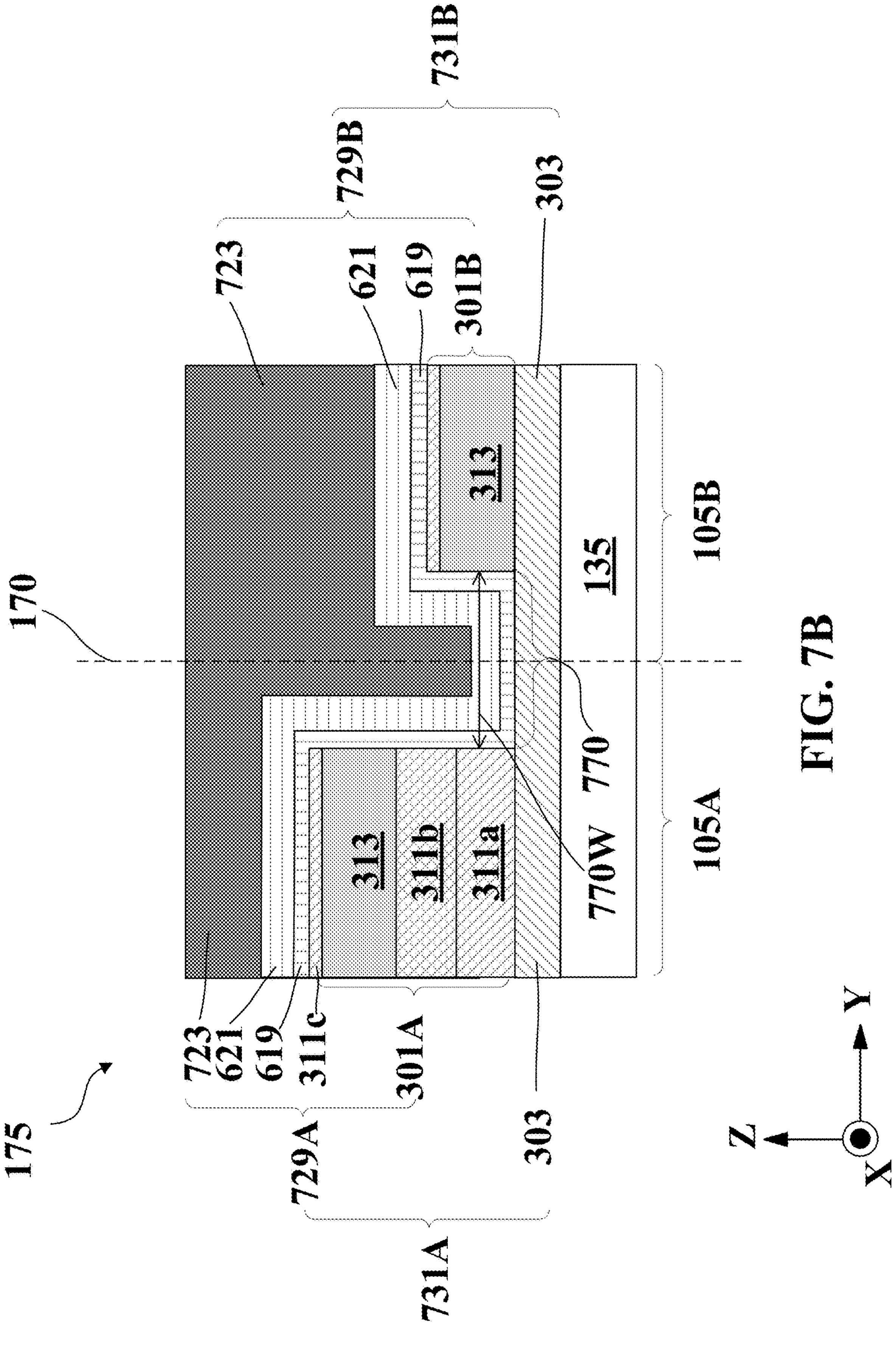

Referring to FIG. 2, method 200 continues with operation 240 and the process of forming a conductive intermediate structure in the trench. As shown in FIGS. 6, 7A, and 7B, a capping layer 619, a glue layer 621, and a metal fill layer 723 can fill in trench 570 and form electrically conductive intermediate structure 770 to block metal diffusion. In some embodiments, gate dielectric layer 303, work function stack 301A, capping layer 619, glue layer 621, and metal fill layer 723 can collectively form a gate structure 731A on fin structures 110A of FET 105A and fill gate stack opening 155. Similarly, gate dielectric layer 303, work function stack 301B, capping layer 619, glue layer 621, and metal fill layer 723 can collectively form a gate structure 731B on fin structures 110B of FET 105B and fill gate stack opening 155. In some embodiments, FIG. 7A shows the cross-sectional view of semiconductor device 100 after the completion of method 200 described in FIG. 2. FIG. 7B shows a cross-sectional view of region 175 at metal boundary 170 of semiconductor device 100.

Capping layer 619 can be formed in trench 570 and on work function stacks 301A and 301B, as shown in FIG. 6. In some embodiments, capping layer 619 can include Si formed by a silane ($SiH_4$) or disilane ($Si_2H_6$) soak process at a temperature from about 250° C. to about 500° C. In some embodiments, capping layer 619 can include SiTi formed by an ALD or PEALD process with $TiCl_4$ and $SiH_4$ precursors. In some embodiments, capping layer 619 can have a thickness 619*t* ranging from about 3 Å to about 60 Å. If thickness 619*t* is less than about 3 Å, capping layer 619 may not provide sufficient protection to aluminum-based work function layer 313 and capping layer 619 may not prevent metal (e.g., aluminum, titanium, etc.) diffusion across metal boundary 170. Additionally, capping layer 619 may not provide sufficient protection to work function stacks 301A and 301B from damages during subsequent processes (e.g., oxidation or contamination during subsequent polishing processes). If thickness 619*t* is greater than about 60 Å, capping layer 619 may increase a gate resistance and shift the work function and thus threshold voltages of FETs 105A and 105B.

Glue layer 621 can be formed on capping layer 619, as shown in FIGS. 6, 7A, and 7B. In some embodiments, glue layer 621 can include Co, Ti, TiN or TiSiN formed by an ALD or PEALD process with $TiCl_4$, $SiH_4$, and $NH_3$ precursors. In some embodiments, glue layer 621 can include Co formed by an ALD process with a Co-based precursor (e.g., dicobalt hexacarbonyl Tert-ButylAcetylene (CCCTBA) and $H_2$). In some embodiments, glue layer 621 can have a thickness 621*t* ranging from about 5 Å to about 110 Å. If thickness 621*t* is less than about 5 Å, glue layer 621 may not provide sufficient bonding to metal fill layer 723 for continuous step coverage across work function stacks 301A and 301B, and glue layer 621 may not prevent metal (e.g., aluminum, titanium, etc.) diffusion across metal boundary 170. If thickness 621*t* is greater than about 110 Å, glue layer 621 may increase the gate resistance and shift the work function and thus threshold voltages of FETs 105A and 105B.

Metal fill layer 723 can be formed on glue layer 621 and fill gate stack opening 155, as shown in FIGS. 7A and 7B. In some embodiments, metal fill layer 723 can include WF or W formed by an ALD or CVD process with a W-based precursor. In some embodiments, a polishing process, such as chemical mechanical polishing (CMP), can follow the ALD process to coplanarize the top surfaces of metal fill layer 723, isolation layer 150, and gate spacers 160.

In addition, semiconductor device 100 can be incorporated into an integrated circuit through the use of other structural components, such as contacts, conductive vias, conductive lines, dielectric layers, and passivation layers, that are not shown for simplicity.

According to some embodiments, electrically conductive intermediate structure 770 to block metal diffusion at metal boundary 170 can include capping layer 619, glue layer 621, and metal fill layer 723 formed on gate dielectric layer 303. In some embodiments, electrically conductive intermediate structure 770 to block metal diffusion can electrically connect work function stacks 301A and 301B at each side of metal boundary 170. In some embodiments, electrically conductive intermediate structure 770 can act as a diffusion barrier structure separating work function stacks 301A and 301B and can block metal (e.g., aluminum) diffusion across metal boundary 170 from aluminum-based work function layer 313 to aluminum-free work function layers 311*a* and 311*b*. As a result, gate structure 780A of FET 105A can electrically connect to adjacent gate structure 780B of FET 105B, and the threshold voltage of FET 105A and FET 105B may not be affected by aluminum diffusion from FET 105B into FET 105A or vice versa.

Electrically conductive intermediate structure 770 can have a width 770W along a Y-axis ranging from about 11 nm to about 90 nm. A ratio of MBD 170*d* to width 770W can range from about 0.8 to about 250. If width 770W is less than about 11 nm, or the ratios is greater than about 250, electrically conductive intermediate structure 770 may not effectively block metal (e.g., aluminum) diffusion across metal boundary 170 from aluminum-based work function layer 313 to aluminum-free work function layers 311*a* and 311*b*. If width 770W is greater than about 90 nm, or the ratio is less than about 0.8, portions of work function stack 301A over fin structures 110A and/or portions of work function stack 301B over fin structures 110B may be removed or damaged during operation 230. Additionally, surfaces of fin structures 110A and 110B may be damaged. As a result, threshold voltages of FET 105A and/or 105B may be negatively affected.

Figure 8A:
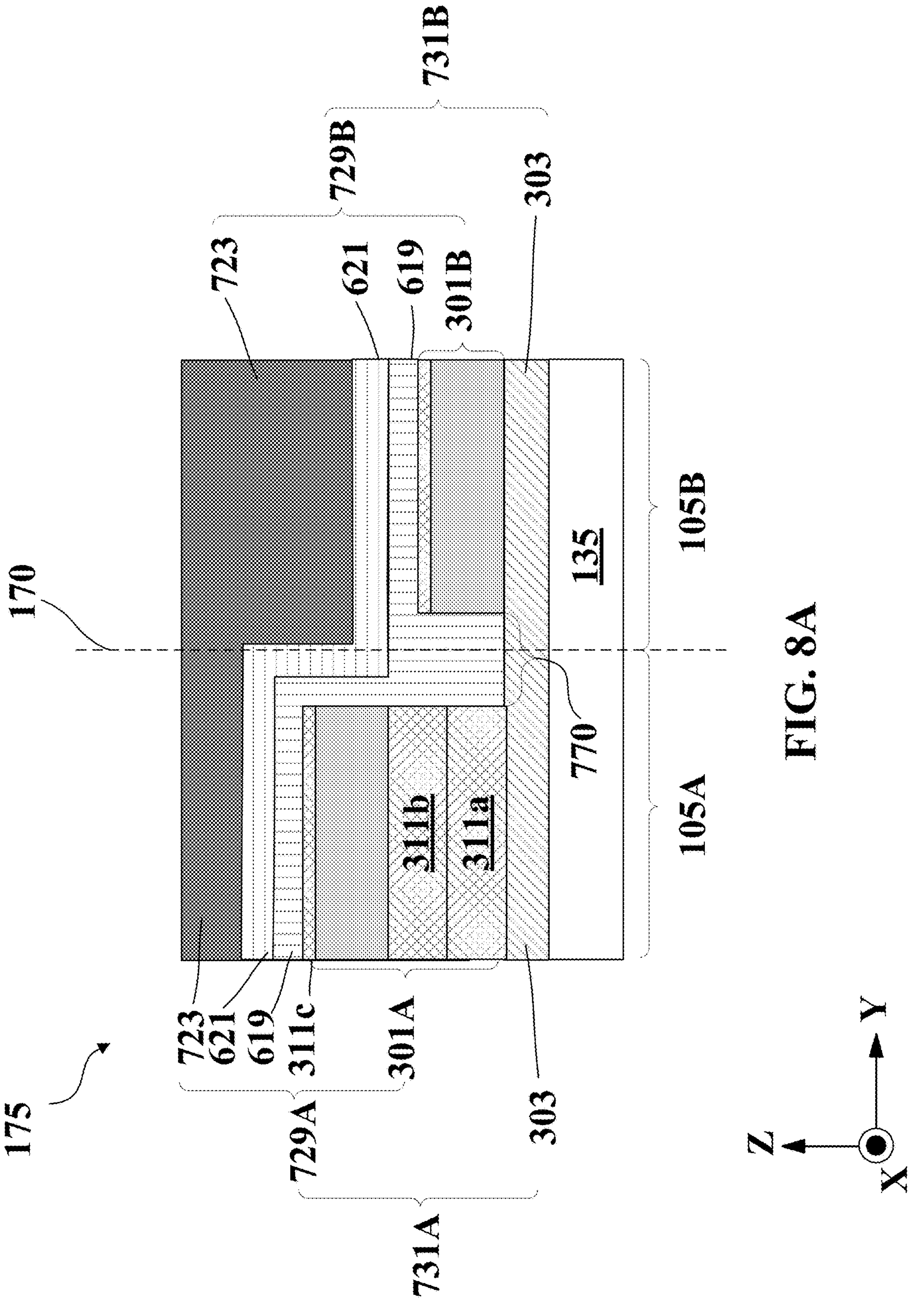
FIGS. 8A-8H illustrate cross-sectional views of a semiconductor device having metal boundary trench isolation with various conductive intermediate structures, in accordance with some embodiments.
Figure 8B:
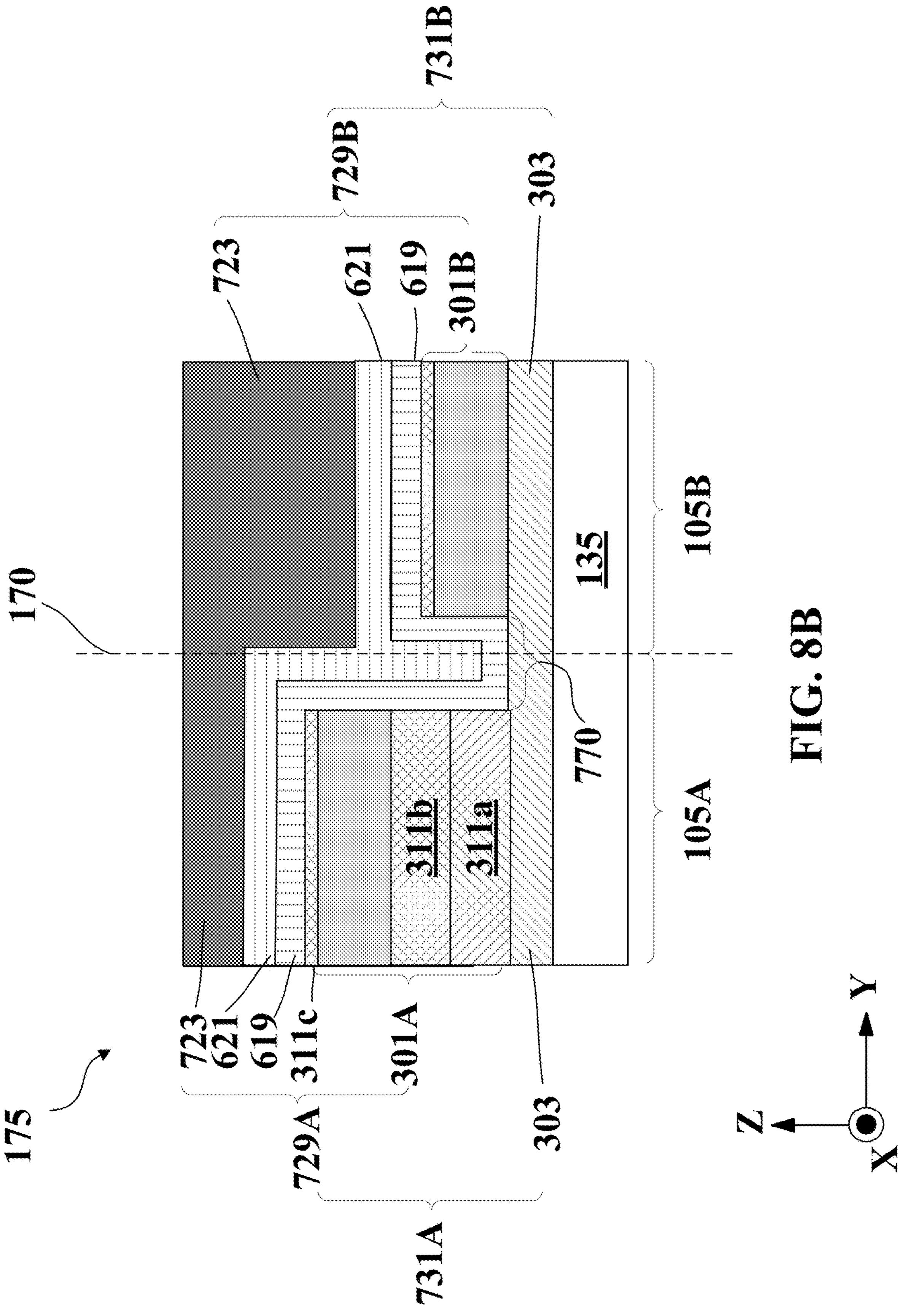
Figure 8C:
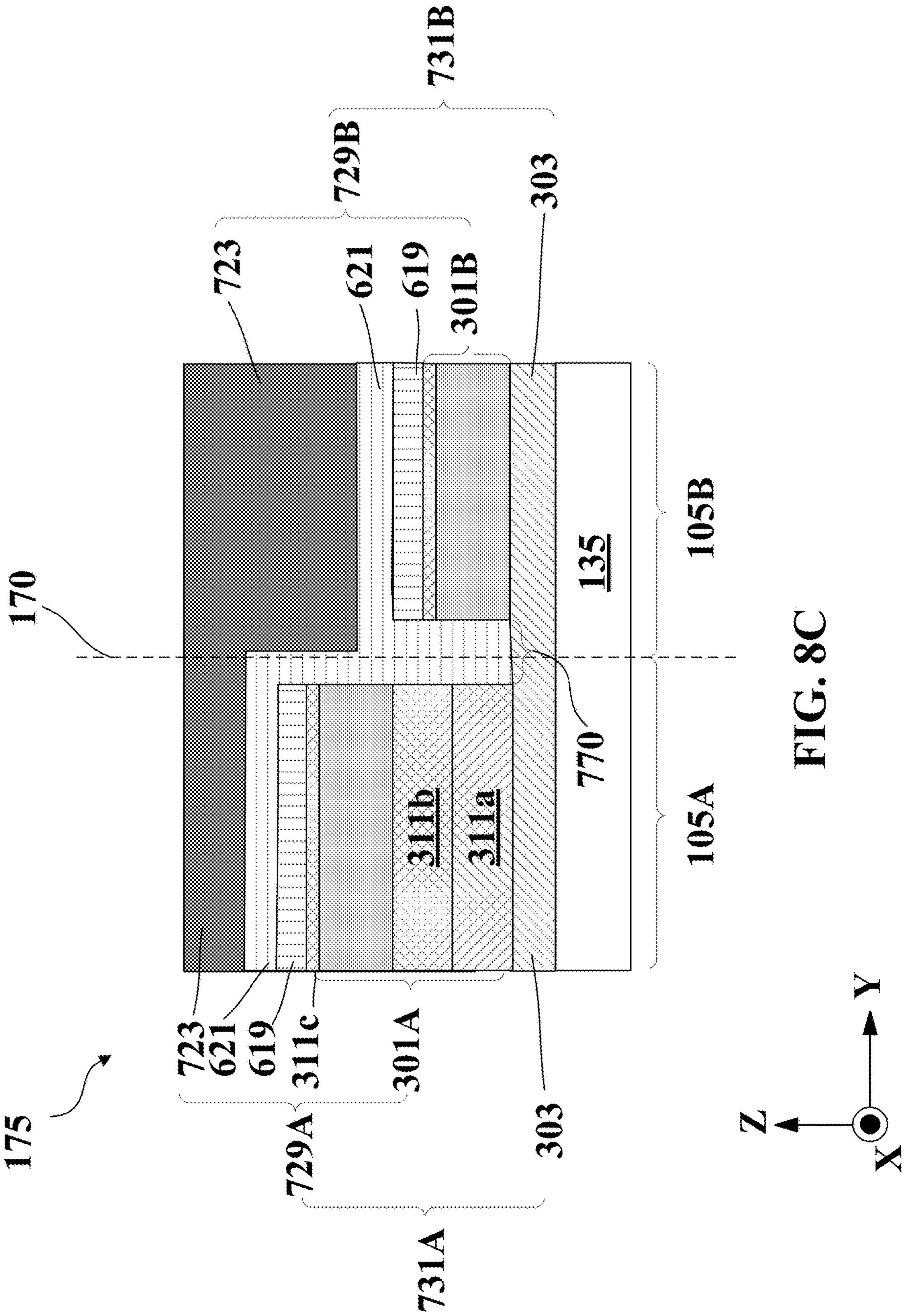
Figure 8D:
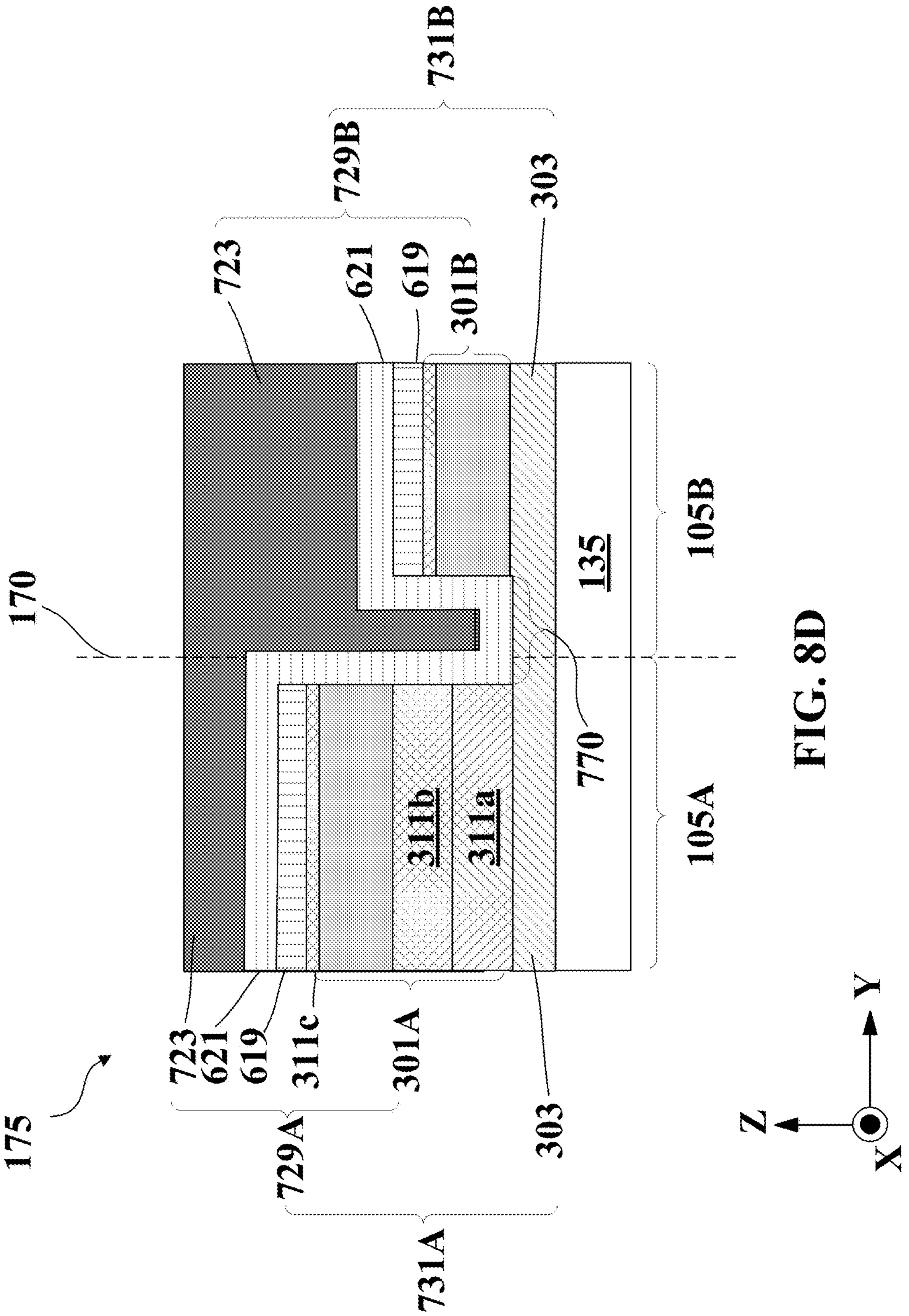
Figure 8E:
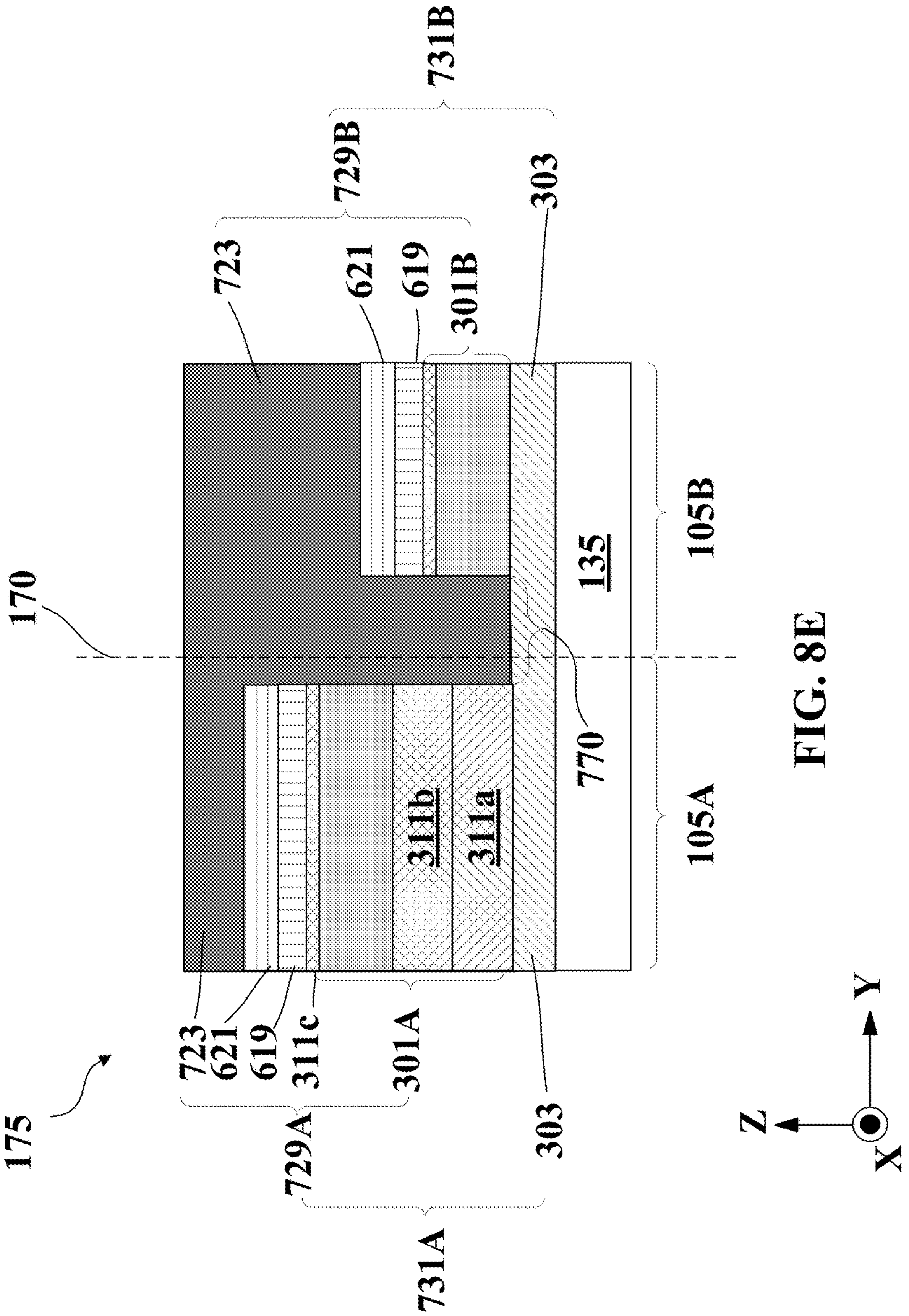
Figure 8F:
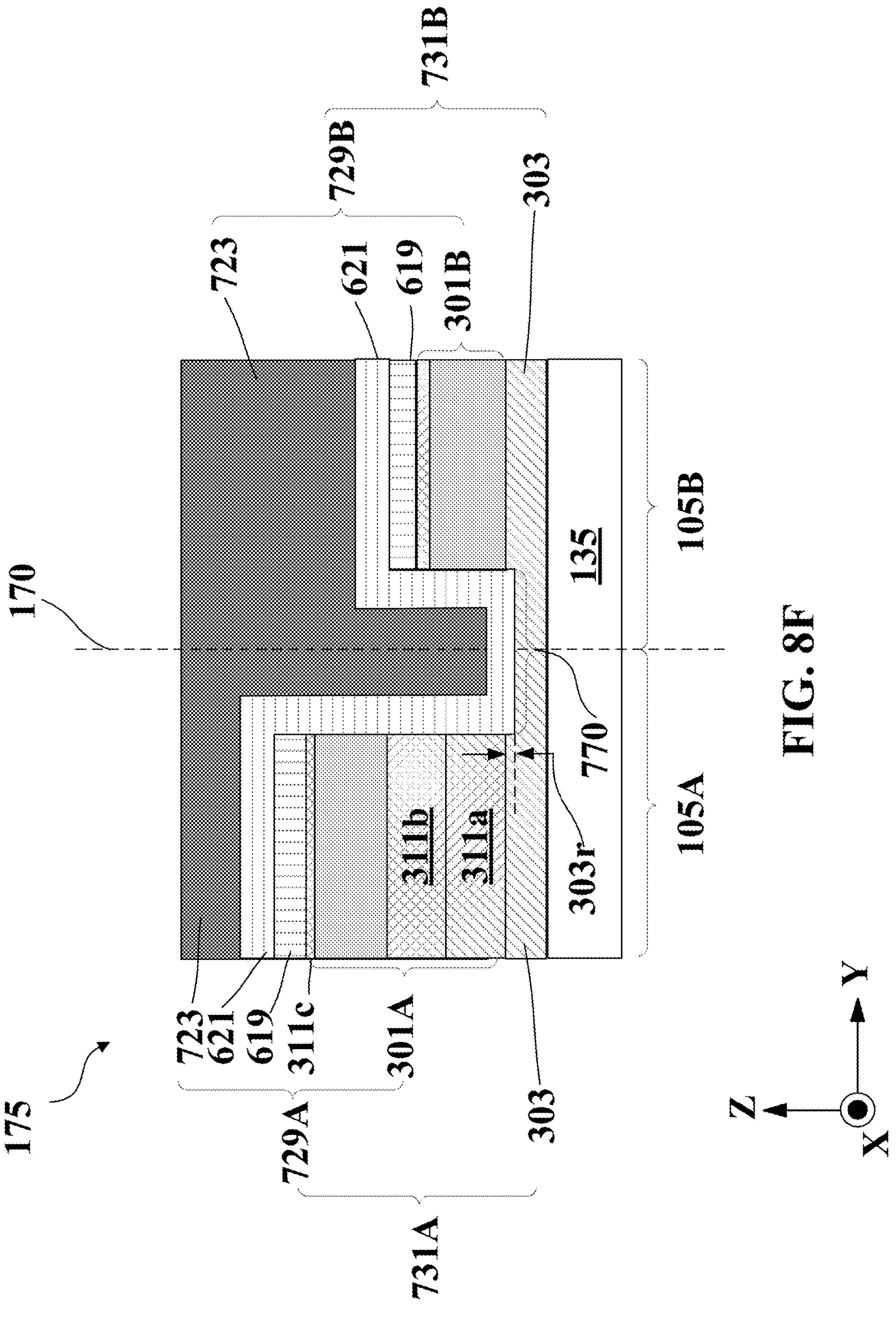
Figure 8G:
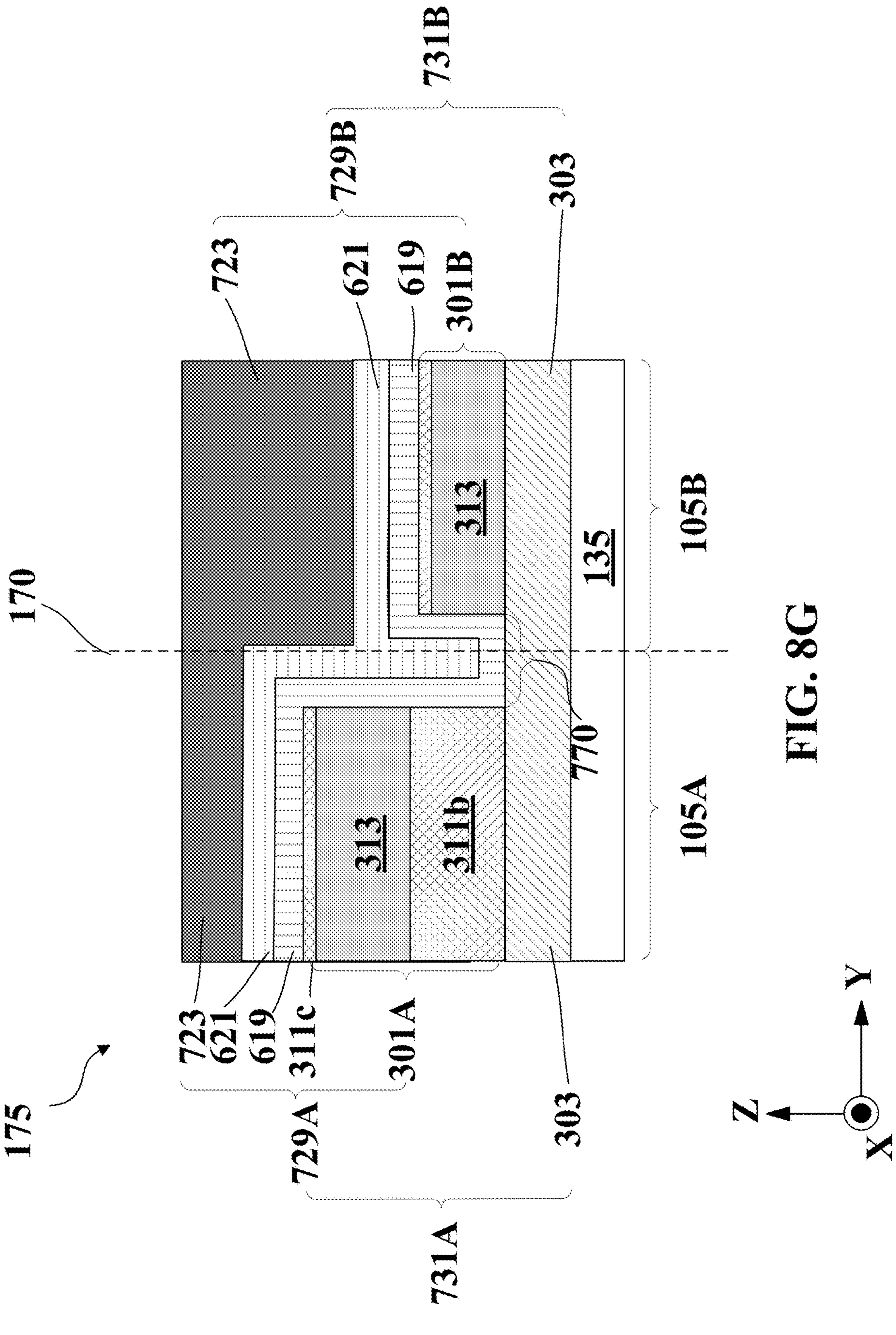
Figure 8H:
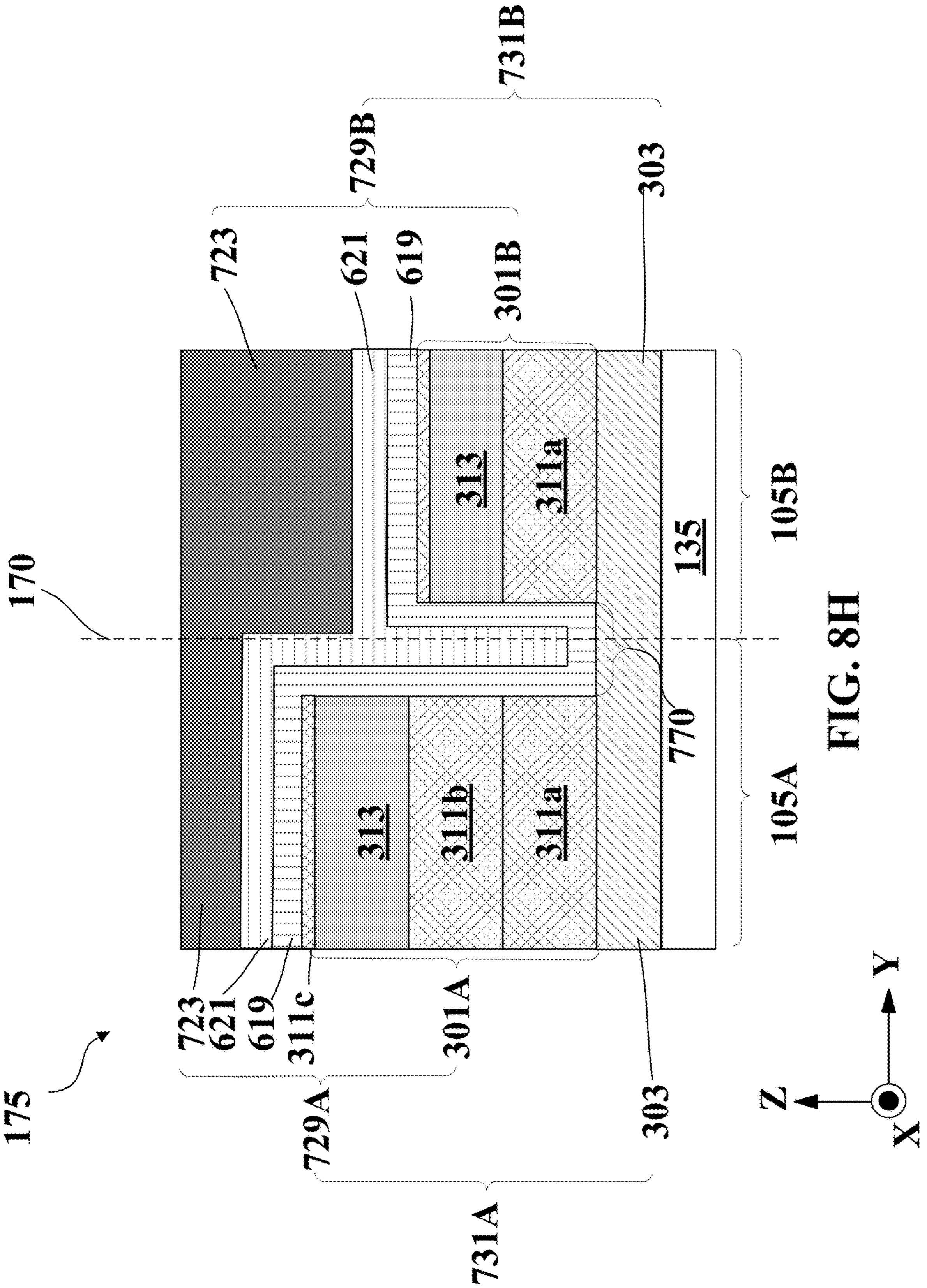

FIGS. 8A-8H illustrate cross-sectional views of a semiconductor device having metal boundary trench isolation with various conductive intermediate structures, in accordance with some embodiments. Electrically conductive intermediate structure 770 can include at least one or capping layer 619, glue layer 621, and metal fill layer 723 depending on width 770W, thicknesses of capping layer 619, glue layer 621, and metal fill layer 723, and location of trench 570 in operation 230. In some embodiments, electrically conductive intermediate structure 770 can include capping layer 619 to separate work function stacks 301A and 301B and block metal (e.g., aluminum, titanium, etc.) diffusion across metal boundary 170, as shown in FIG. 8A. In some embodiments, electrically conductive intermediate structure 770 can include capping layer 619 and glue layer 621 to separate work function stacks 301A and 301B and block metal (e.g., aluminum, titanium, etc.) diffusion across metal boundary 170, as shown in FIG. 8B. In some embodiments, opening 470 and trench 570 can be formed after the formation of capping layer 619. As a result, electrically conductive intermediate structure 770 can include glue layer 621 to separate work function stacks 301A and 301B and block metal (e.g., aluminum, titanium, etc.) diffusion across metal boundary 170 as shown in FIG. 8C. In some embodiments, electrically conductive intermediate structure 770 can include glue layer 621 and metal fill layer 723 to separate work function stacks 301A and 301B and block metal (e.g., aluminum, titanium, etc.) diffusion across metal boundary 170 as shown in FIG. 8D. In some embodiments, opening 470 and trench 570 can be formed after the formation of glue layer 621. As a result, electrically conductive intermediate structure 770 can include metal fill layer 723 to separate work function stacks 301A and 301B and block metal (e.g., aluminum, titanium, etc.) diffusion across metal boundary 170 as shown in FIG. 8E. In some embodiments, opening 470 and trench 570 can be formed after the formation of metal fill layer 723. Metal fill layer 723 can be re-deposited in trench 570 to form electrically conductive intermediate structure 770 as shown in FIG. 8E. In some embodiments, gate dielectric layer 303 can be partially removed due to process variations during or after the removal of a portion of work function stacks 301A and 301B to form trench 570. As a result, electrically conductive intermediate structure 770 can be formed at metal boundary 170 between FET 105A and FET 105B as shown in FIG. 8F. In some embodiments, gate dielectric layer 303 can have a recess 303*r* along a Z-axis ranging from about 3 Å to about 7 Å. In some embodiment, a ratio of recess 303*r* to the thickness of gate dielectric layer 303 can range from about 0.2 to about 0.5. In some embodiments, electrically conductive intermediate structure 770 can include capping layer 619, glue layer 621, and metal fill layer 723 partially on gate dielectric layer 303 to separate work function stacks 301A and 301B and block metal (e.g., aluminum, titanium, etc.) diffusion across metal boundary 170 as shown in FIG. 8F. In some embodiments, electrically conductive intermediate structure 770 can include one or more of capping layer 619, glue layer 621, and metal fill layer 723 on gate dielectric layer 303 to separate work function stacks 301A and 301B and block metal (e.g., aluminum, titanium, etc.) diffusion across metal boundary 170. In some embodiments, work function stack 301A can include p-type work function layer 311*b* and work function stack 301B may not include p-type work function layers 311*a* or 311*b*, as shown in FIG. 8G. In some embodiments, work function stack 301A can include p-type work function layers 311*a* and 311*b* and work function stack 301B can include p-type work function layer 311*a*, as shown in FIG. 8H. In some embodiments, one or more p-type work function layers can be formed in trench 570 before depositing capping layer 619 (not shown). As a result, electrically conductive intermediate structure 770 can include one or more p-type work function layers, capping layer 619, glue layer 621, and metal fill layer 723 formed on gate dielectric layer 303 (e.g., formed partially on gate dielectric layer 303). In some embodiments, one or more p-type work function layers can be formed in trench 570 after depositing n-type work function layer 313 and capping layer 619 (not shown). In some embodiments, work function stack 301A can include n-type work function layer 313 and work function stack 301B may not include n-type work function layers 313 (not shown). In some embodiments, work function stack 301A can include two or more n-type work function layer 313 and work function stack 301B may include one or non-type work function layer 313 (not shown). As a result, electrically conductive intermediate structure 770 can include one or more n-type work function layers, capping layer 619, p-type work function layers, glue layer 621, and metal fill layer 723 formed on gate dielectric layer 303 (e.g., formed partially on gate dielectric layer 303).

Figure 9B:
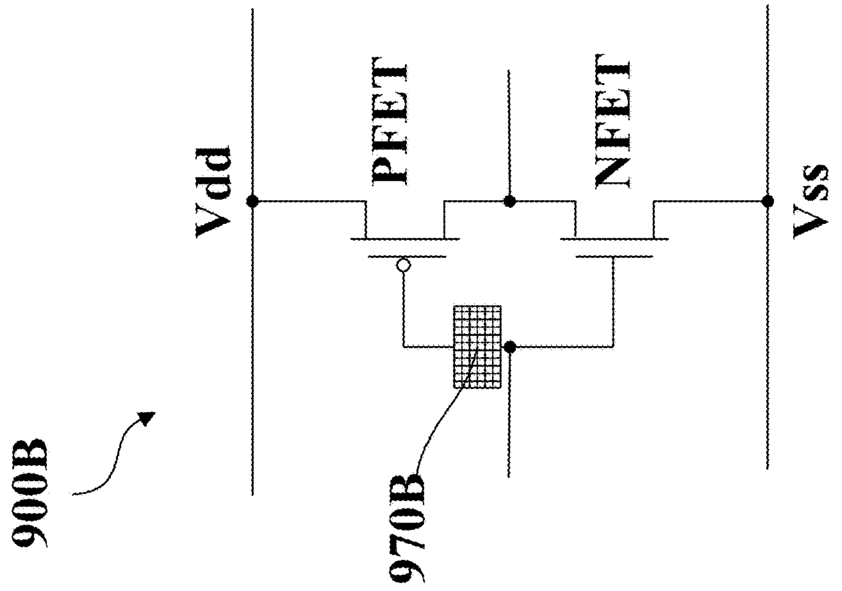
FIGS. 9A-9D illustrate layout arrangements of conductive intermediate structures in a semiconductor device having metal boundary trench isolation with conductive intermediate structures, in accordance with some embodiments.
Figure 9A:
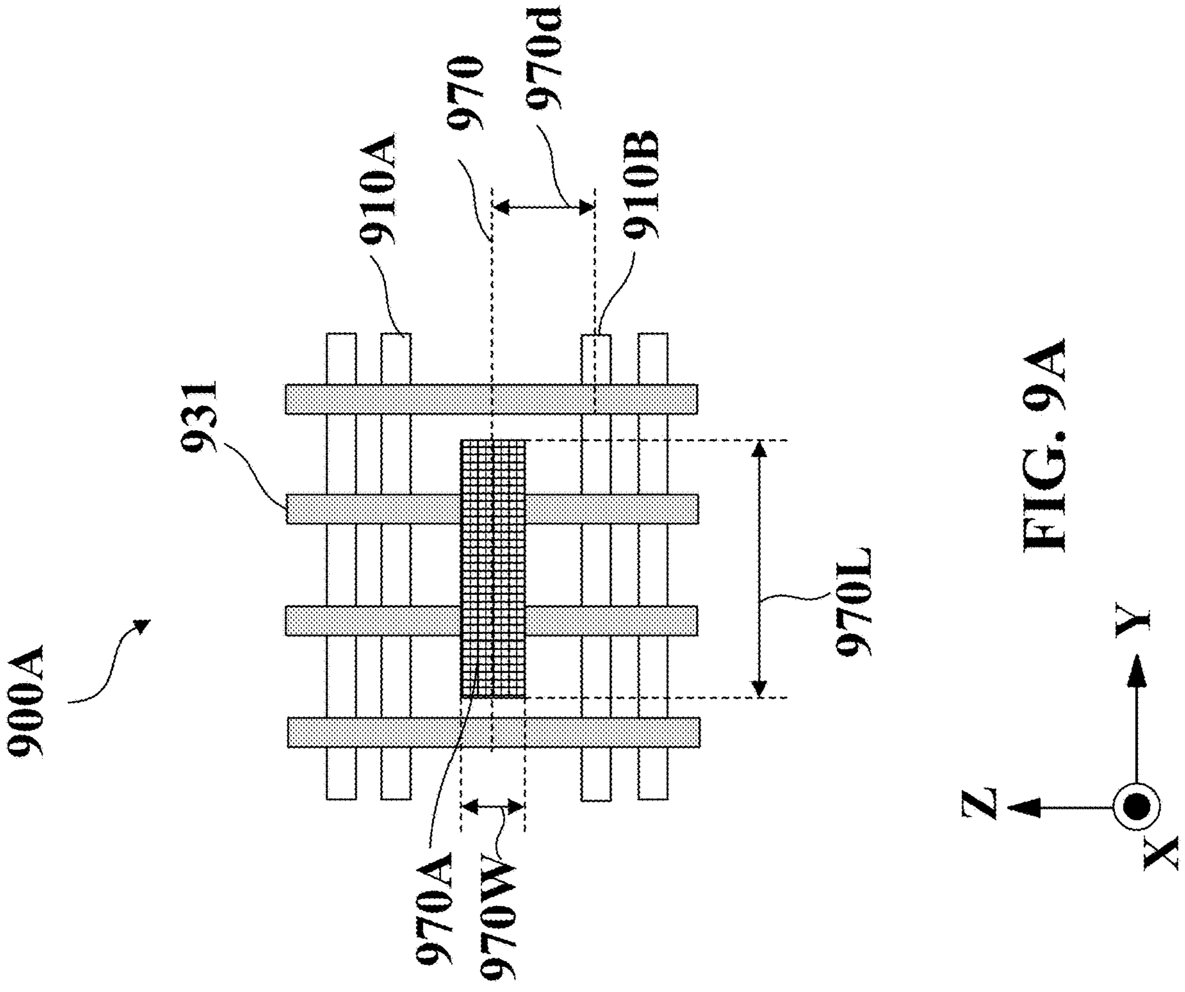

FIGS. 9A-9D illustrate layout arrangements of electrically conductive intermediate structures 970A, 970B, and 970C in semiconductor devices 900A, 900B, 900C respectively, in accordance with some embodiments. In some embodiments, as shown in FIG. 9A, electrically conductive intermediate structures 970A to block metal diffusion can be formed at metal boundary 970 with connected gate structures 931 on fin structures 910A and 910B. In some embodiments, electrically conductive intermediate structures 970A can have a width 970W along a Y-axis ranging from about 11 nm to about 90 nm. In some embodiments, electrically conductive intermediate structures 970A can have a length 970L along an X-axis ranging from about 45 nm to about 800 nm. If width 970W is less than about 11 nm, or the length 970L is less than about 45 nm, electrically conductive intermediate structure 970A may not effectively block metal (e.g., aluminum and titanium) or contamination (e.g., carbon, chlorine, fluorine, and nitrogen) diffusion across metal boundary 970. If width 970W is greater than about 90 nm, or about 1.6 times greater than MBD 970*d*, then the portions of work function stacks of connected gate structures 931 over fin structures 910 may be removed or damaged. As a result, the device performance and/or the threshold voltages of semiconductor device 900A may be negatively affected. If length 970L is greater than about 800 nm, portions of work function stacks of adjacent FET devices over fin structures may be removed. As a result, device performance of adjacent FET devices may be negatively affected. In some embodiments, length 970L can be required to be greater than the total gate width along an X-axis of connected gates on FET devices with different threshold voltages.

Figure 9D:
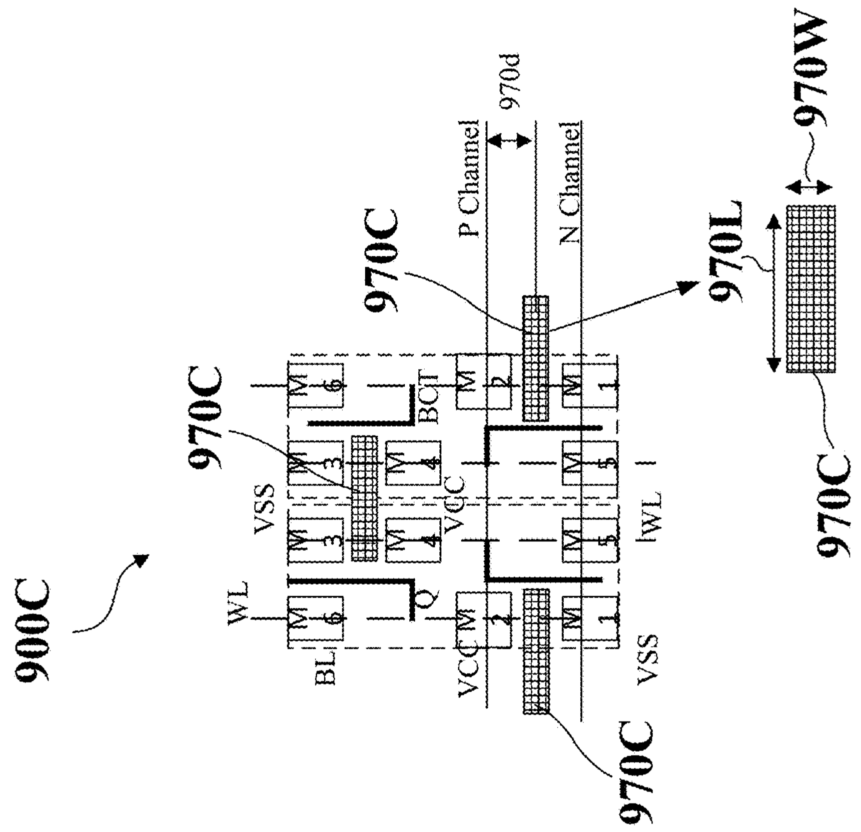
Figure 9C:
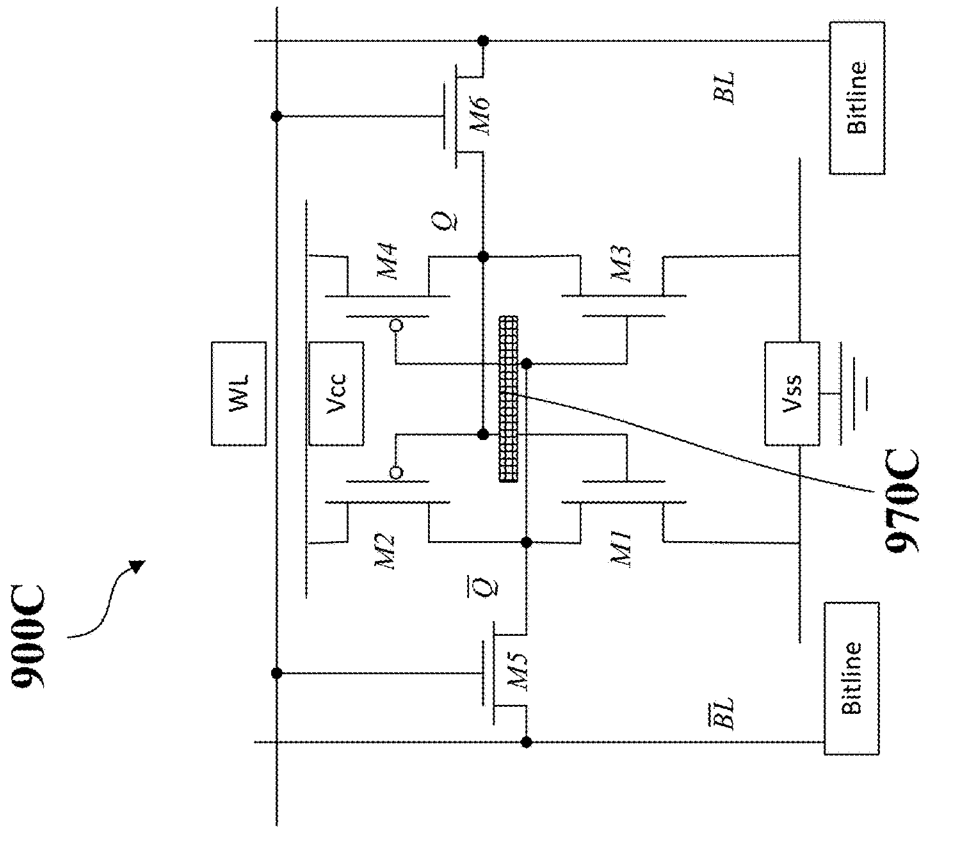

In some embodiments, as shown in FIG. 9B, electrically conductive intermediate structures 970B to block metal diffusion can be formed at N-P metal boundary with connected gates of semiconductor device 900B (e.g., an inverter logic device). In some embodiments, FIGS. 9C and 9D illustrate a circuit layout arrangement and a design layout arrangement of semiconductor device 900C, respectively. As shown in FIGS. 9C and 9D, electrically conductive intermediate structures 970C to block metal diffusion can be formed at N-P metal boundaries with connected gates of semiconductor device 900C (e.g., between pull-up and pull-down devices of SRAM cell). In some embodiments, electrically conductive intermediate structures can be formed at N-P metal boundary with connected gates of other semiconductor devices. For example, conductive intermediate structures can be formed between PFET and NFET of each inverter of a ring oscillator device, between two PFETs and two NFETs of a NAND or a NOR logic device, and between 1 PFET and 2 NFETs of a NOT logic device.

Figure 10:
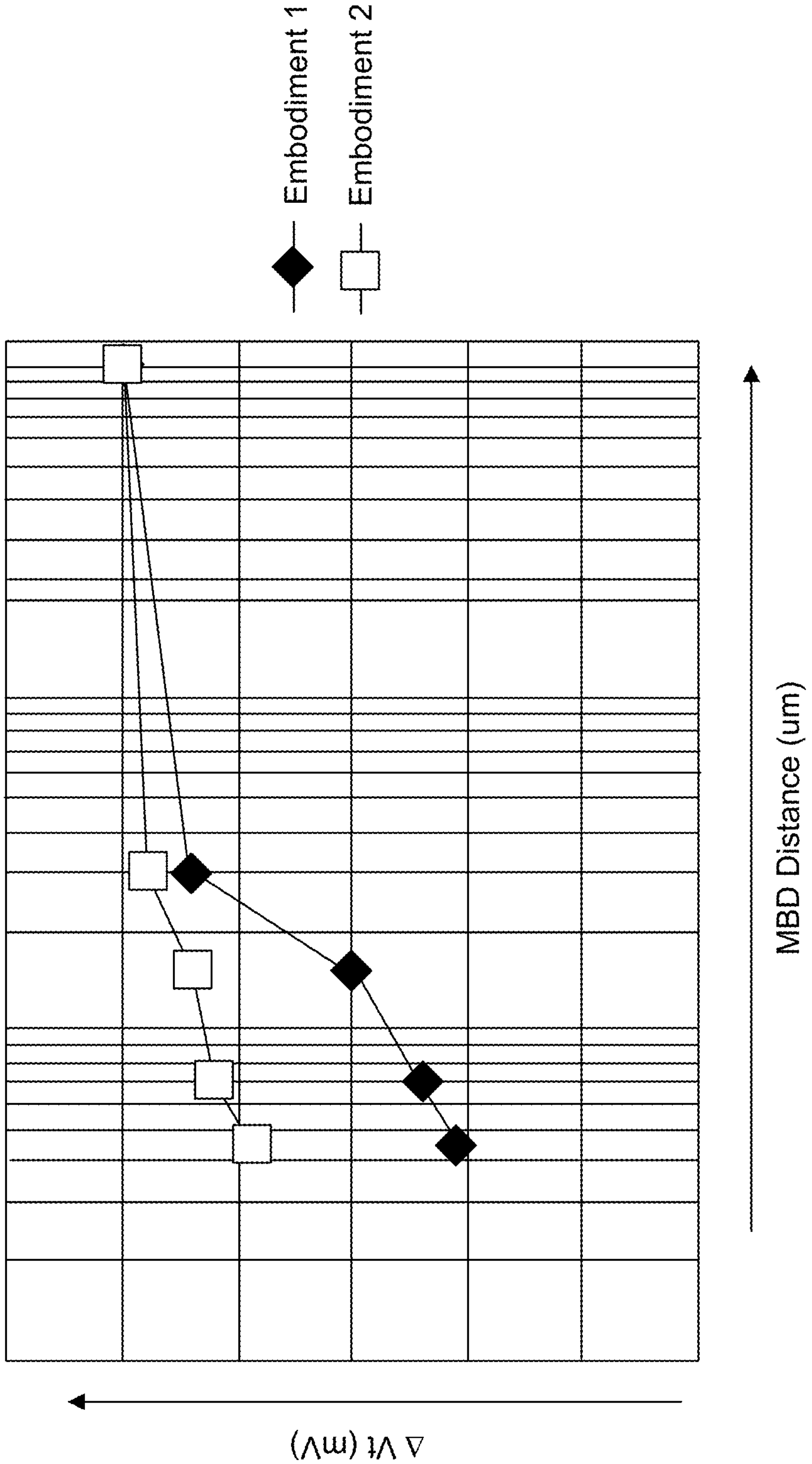
FIG. 10 illustrates a relationship between threshold voltage shift and metal boundary to channel distance (MBD), in accordance with some embodiments.

FIG. 10 illustrates a relationship between threshold voltage ($V_t$) change and metal boundary to channel distance (MBD), in accordance with some embodiments. In some embodiments, embodiment 1 in FIG. 10 can include a semiconductor device having metal boundary trench isolation with electrically conductive intermediate structures. Embodiment 2 can include a semiconductor device without metal boundary trench isolation. It can be seen that embodiment 1 can have smaller $V_t$ change than embodiment 2 across different MBD. And the different between $V_t$ changes of embodiment 1 and embodiment 2 can decrease with the increase of MBD.

According to some embodiments, method 200 is not limited to finFETs but can be applicable to other transistors such as gate all around FETs, planar FETs, or FET devices with adjacent transistors having connected gate structures and different threshold voltages.

Various embodiments in the present disclosure provide methods for forming a semiconductor device 100 having metal boundary trench isolation with an electrically conductive intermediate structure 770 to block metal diffusion. In some embodiments, conductive intermediate structure 770 can be formed in trench 570 formed at metal boundary 170. In some embodiments, conductive intermediate structure 770 can be between work function stacks 301A and 301B at each side of metal boundary 170. In some embodiments, conductive intermediate structure 770 can electrically connect work function stacks 301A and 301B at each side of metal boundary 170. In some embodiments, conductive intermediate structure 770 can be a conductive barrier structure and block the metal (e.g., aluminum, titanium, etc.) or contamination (e.g., carbon, chlorine, fluorine, and nitrogen) diffusion across metal boundary 170. In some embodiments, conductive intermediate structure 770 can include at least one of capping layer 619, glue layer 621, and metal fill layer 723. In some embodiments, conductive intermediate structure 770 can be formed on gate dielectric layer 303 at metal boundary 170. In some embodiments, conductive intermediate structure 770 can include at least one of silicon (Si), silicon-titanium (SiTi), titanium (Ti), titanium nitride (TN), titanium carbo nitride (TiCN), titanium silicon nitride (TiSiN), silicon-tantalum (SiTa), tantalum (Ta), tantalum nitride (TaN), tantalum carbo nitride (TaCN), tungsten nitride (WNx), tungsten carbo nitride (WCN), Ruthium (Ru), cobalt (Co), and tungsten (W), which can electrically connect work function stacks 301A and 301B and block metal (e.g., aluminum, titanium, etc.) or contamination (e.g., carbon, chlorine, fluorine, and nitrogen) diffusion across metal boundary 170.

In some embodiments, a semiconductor structure includes a first fin structure and a second fin structure on a substrate, an insulating layer between the first and second fin structures, a gate dielectric layer on the insulating layer and the first and second fin structures, and a first work function stack and a second work function stack on the gate dielectric layer. The first work function stack is over the first fin structure and a first portion of the insulating layer, and the second work function stack is over the second fin structure and a second portion of the insulating layer adjacent to the first portion. The semiconductor structure further includes a conductive intermediate structure on the gate dielectric layer and between the first and second work function stacks.

In some embodiments, a semiconductor device includes a first transistor including a first work function stack and a second transistor including a second work function stack. The semiconductor device further includes an insulating layer between the first and second transistors, a gate dielectric layer between the insulating layer and the first and second work function stacks, and a barrier structure on the gate dielectric layer and between the first and second work function stacks.

In some embodiments, a method includes forming a gate dielectric layer on a first fin structure, a second fin structure, and an insulating layer between the first and second fin structures. The method further includes forming a first work function stack and a second work function stack on the gate dielectric layer and over the first fin structure and the second fin structure respectively, forming a trench between the first and second work function stacks, and forming a conductive intermediate structure in the trench.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a gate dielectric layer on an insulating layer and first and second semiconductor fin structures, wherein the gate dielectric layer is in contact with top and sidewall surfaces of the first and second semiconductor fin structures;

first and second work function stacks on the gate dielectric layer, wherein a type of the first work function stack is different from a type of the second work function stack; and a conductive structure on the first and second semiconductor fin structures and in contact with the gate dielectric layer, wherein the conductive structure separates the first work function stack from the second work function stack.

2. The semiconductor device of claim 1, wherein the gate dielectric layer comprises an interfacial layer on the insulating layer and a high-k dielectric layer on the interfacial layer.

3. The semiconductor device of claim 1, wherein the conductive structure extends into the gate dielectric layer.

4. The semiconductor device of claim 1, wherein the conductive structure is in contact with sidewalls of the first and second work function stacks.

5. The semiconductor device of claim 1, wherein:

the first work function stack comprises an aluminum-free work function layer;

the second work function stack comprises an aluminum-based work function layer; and the conductive structure separates the aluminum-free work function layer and the aluminum-based work function layer.

6. The semiconductor device of claim 1, wherein the conductive structure comprises at least one of a capping layer, a glue layer, and a metal fill layer.

7. The semiconductor device of claim 6, wherein the capping layer comprises silicon or silicon-titanium, and wherein the glue layer comprises titanium, titanium nitride, titanium silicon nitride, or cobalt.

8. The semiconductor device of claim 1, further comprising a metal fill layer on the first and second work function stacks.

9. A semiconductor structure, comprising:

first and second semiconductor fin structures on a substrate;

a gate dielectric layer on the first and second semiconductor fin structures, wherein the gate dielectric layer is in contact with top and sidewall surfaces of the first and second semiconductor fin structures;

a first work function stack on the gate dielectric layer over the first semiconductor fin structure;

a second work function stack on the gate dielectric layer over the second semiconductor fin structure; and a barrier structure on the first and second semiconductor fin structures, wherein the barrier structure is in contact with a top surface of the gate dielectric layer and sidewall surfaces of the first and second work function stacks.

10. The semiconductor structure of claim 9, wherein the gate dielectric layer comprises an interfacial layer and a high-k dielectric layer.

11. The semiconductor structure of claim 9, wherein a portion of the barrier structure is in the gate dielectric layer.

12. The semiconductor structure of claim 9, wherein the barrier structure separates the first work function stack from the second work function stack.

13. The semiconductor structure of claim 9, wherein:

the first work function stack comprises an aluminum-free work function layer;

the second work function stack comprises an aluminum-based work function layer; and the barrier structure separates the aluminum-free work function layer and the aluminum-based work function layer.

14. The semiconductor structure of claim 9, wherein the barrier structure comprises at least one of a capping layer, a glue layer, and a metal fill layer.

15. The semiconductor structure of claim 14, wherein the capping layer comprises silicon or silicon-titanium, and wherein the glue layer comprises titanium, titanium nitride, titanium silicon nitride, or cobalt.

16. A semiconductor device, comprising:

a first transistor comprising a first channel structure and a first work function stack on a first portion of a gate dielectric layer, wherein the gate dielectric layer is in contact with top and sidewall surfaces of the first channel structure;

a second transistor comprising a second channel structure and a second work function stack on a second portion of the gate dielectric layer, wherein the gate dielectric layer is in contact with top and sidewall surfaces of the second channel structure; and a conductive structure on the first and second channel structures and at a boundary of the first and second portions of the gate dielectric layer, wherein the conductive structure is in contact with the gate dielectric layer and separates the first and second work function stacks.

17. The semiconductor device of claim 16, wherein a portion of the conductive structure is in the gate dielectric layer.

18. The semiconductor device of claim 16, wherein the conductive structure is in contact with sidewalls of the first and second work function stacks.

19. The semiconductor device of claim 16, wherein:

the first work function stack comprises an aluminum-free work function layer;

the second work function stack comprises an aluminum-based work function layer; and the conductive structure separates the aluminum-free work function layer and the aluminum- based work function layer.

20. The semiconductor device of claim 16, wherein the conductive structure comprises at least one of a capping layer, a glue layer, and a metal fill layer.

* * * * *